United States Patent
Yoshida

(10) Patent No.: US 11,361,127 B2
(45) Date of Patent: Jun. 14, 2022

(54) SIMULATION DEVICE, SIMULATION METHOD, AND STORAGE MEDIUM

(71) Applicant: NEC Corporation, Tokyo (JP)

(72) Inventor: Takashi Yoshida, Tokyo (JP)

(73) Assignee: NEC CORPORATION, Tokyo (JP)

(*) Notice: Subject to any disclaimer, the term of this patent is extended or adjusted under 35 U.S.C. 154(b) by 641 days.

(21) Appl. No.: 16/318,765

(22) PCT Filed: Jul. 20, 2017

(86) PCT No.: PCT/JP2017/026199
§ 371 (c)(1),
(2) Date: Jan. 18, 2019

(87) PCT Pub. No.: WO2018/016558
PCT Pub. Date: Jan. 25, 2018

(65) Prior Publication Data
US 2019/0286766 A1    Sep. 19, 2019

(30) Foreign Application Priority Data
Jul. 22, 2016   (JP) .............................. JP2016-144495

(51) Int. Cl.
*G06F 30/20*    (2020.01)
*G08G 1/01*    (2006.01)
(Continued)

(52) U.S. Cl.
CPC .............. *G06F 30/20* (2020.01); *G06Q 10/04* (2013.01); *G08G 1/00* (2013.01); *G08G 1/005* (2013.01); *G08G 1/01* (2013.01); *G08G 1/166* (2013.01)

(58) Field of Classification Search
CPC ........ G06Q 30/08; G06Q 10/00; G06Q 10/02; G06Q 10/025; G06Q 50/265; G06Q 50/30;
(Continued)

(56) References Cited

U.S. PATENT DOCUMENTS

2003/0203717 A1* 10/2003 Chuprun ............ G06K 13/0825
455/12.1
2008/0293464 A1* 11/2008 Cheng ..................... A63F 13/10
463/3
(Continued)

FOREIGN PATENT DOCUMENTS

JP      H4-75199 A     3/1992
JP      H9-190463 A    7/1997
(Continued)

OTHER PUBLICATIONS

International Search Report for PCT Application No. PCT/JP2017/026199, dated Oct. 3, 2017.
(Continued)

*Primary Examiner* — Daniel Previl

(57) ABSTRACT

The present invention provides a simulation device, etc. in which the computational load for computing behavior of a pedestrian or the like is reduced while suppressing inaccuracy in simulation. This simulation device is provided with a processor configured to: select, based on a position of a moving object model that is a virtual moving object positioned within a virtual map including a plurality of cells, one or more of the plurality of cells, as candidates for a post-movement place of the moving object model; compute, for each candidate of the candidates, a margin level that represents a degree of a margin of the each candidate for newly accepting the moving object model; and determine the post-movement place from among the candidates, based on
(Continued)

the margin level and a reference direction associated with the moving object model.

20 Claims, 12 Drawing Sheets

(51) Int. Cl.
*G06Q 10/04* (2012.01)
*G08G 1/00* (2006.01)
*G08G 1/005* (2006.01)
*G08G 1/16* (2006.01)

(58) Field of Classification Search
CPC ........... G06Q 30/0207; G06Q 30/0282; G06Q 40/00; G06Q 40/04; G06Q 50/188; G06Q 20/0652; G06Q 20/10; G06Q 20/308; G06Q 20/401; G06Q 40/025; G06Q 40/06; G06Q 10/0631; G06Q 10/0635; G06Q 10/06375; G06Q 10/103; G06Q 20/065; G06Q 20/22; G06Q 20/40; G06Q 30/0201; G06Q 10/04; G07B 15/00; G07B 15/02; G07B 15/063; G07F 17/0021; G07F 17/246; G07F 17/32; G07F 17/323; G07F 17/3237; G08B 25/12; G08G 1/14; G08G 1/142; G08G 1/147; G08G 1/148; G08G 1/00; G08G 1/005; G08G 1/01; G08G 1/166; H04N 7/18; A61L 27/48; A61L 27/18; A61L 2300/252; A61L 27/225; A61L 27/227; A61L 27/54; A61L 27/58; H04W 4/029; H04W 16/28; H04W 64/003; H04W 72/082; H04W 84/18; C08L 71/02; C08L 89/00; G06F 30/20; G06F 2111/10; G06F 30/15; G06F 30/23; A61K 2800/57; A61K 35/32; A61K 38/1709; A61K 38/39; A61K 8/64; A61P 17/00; A61P 19/00; A61Q 11/00; B60W 10/06; B60W 10/08; B60W 2050/0013; B60W 20/00; B60W 20/11; B60W 20/13; B60W 2420/52; B60W 2554/406; B60W 2710/244; B60W 2720/10; B60W 2720/106; B60W 30/12; B60W 30/18163; B60W 40/04; G01B 11/026; G01B 11/26; G01B 15/00; G01S 13/878; G01S 13/933; G01S 15/08; G01S 15/42; G01S 17/08; G01S 2013/468; Y02T 90/00; Y02T 90/50; Y10S 903/93
USPC ............ 340/693.8, 693.4, 10.42, 566, 568.4, 340/571–572.9, 582, 636.16, 691.6, 340/825.28, 5.1, 10.51
See application file for complete search history.

(56) References Cited

U.S. PATENT DOCUMENTS

| | | | |
|---|---|---|---|
| 2013/0002407 A1* | 1/2013 | Terrier | G07B 15/00 340/10.42 |
| 2013/0073388 A1* | 3/2013 | Heath | G06Q 50/01 705/14.53 |
| 2015/0049004 A1* | 2/2015 | Deering | G02B 27/0093 345/8 |
| 2016/0170996 A1* | 6/2016 | Frank | G06F 16/24578 707/748 |

FOREIGN PATENT DOCUMENTS

| | | |
|---|---|---|
| JP | H10-256981 A | 9/1998 |
| JP | 2000-259603 A | 9/2000 |
| JP | 2008-129874 A | 6/2008 |
| JP | 2009-19920 A | 1/2009 |
| JP | 2009-301295 A | 12/2009 |
| JP | 2012-027560 A | 2/2012 |
| JP | 2014-23548 A | 2/2014 |
| JP | 2016-045919 A | 4/2016 |

OTHER PUBLICATIONS

English translation of Written opinion for PCT Application No. PCT/JP2017/026199.

* cited by examiner

| CELL C1 | CELL C2<br>1/1 | CELL C3 |
|---|---|---|
| CELL C4<br><br>1/2 | CELL C5<br><br>2/2 | CELL C6<br><br>2/2 |
| CELL C7<br><br>2/2 | CELL C8<br><br>2/2 | CELL C9<br><br>0/2 |

SIMULATION DEVICE, SIMULATION METHOD, AND STORAGE MEDIUM

This application is a National Stage Entry of PCT/JP2017/026199 filed on Jul. 20, 2017, which claims priority from Japanese Patent Application 2016-144495 filed on Jul. 22, 2016, the contents of all of which are incorporated herein by reference, in their entirety.

TECHNICAL FIELD

The present disclosure relates to simulation of movement of an object.

BACKGROUND ART

For the purpose of evaluating easiness in movement of a pedestrian, a bicycle, a wheelchair, or the like (hereinafter, referred to as a "pedestrian or the like") that moves along a sidewalk or the like, or evaluating a method of guiding a pedestrian or the like in a desired direction, simulation for simulating, on a computer, an appearance of moving of a pedestrian or the like may be performed. This simulation is performed by quantifying, for example, a condition about a sidewalk present in a city area or the like, an appearance of moving of a pedestrian or the like on a sidewalk, or the like.

PTL 1 describes a traffic simulation device and the like. In a technique described in PTL 1, from a plurality of candidates for a path from a departure place to a destination of a pedestrian that are generated on the basis of map information, a path is selected in consideration of a risk in each path. Then, a traffic state is simulated by moving, along the selected path, a pedestrian model and the like generated by modeling a pedestrian.

PTL 2 describes an evacuation behavior simulation system based on a so-called cellular automaton. In the evacuation behavior simulation system described in PTL 2, a space within a building or an outdoor space is divided into cells, and each evacuee is arranged in any one of the cells. A cell corresponding to the next post-movement place of an evacuee is determined on the basis of a rule according to density of evacuees, for each discrete time step.

PTL 3 describes a crowd walk simulation system. In the crowd walk simulation system described in PTL 3, setting is made in such a way that a repulsive force dependent on a distance acts between pedestrians and between a pedestrian and an obstacle, and in such a way that a constant attractive force irrelevant to a distance acts between a pedestrian and an objective point.

PTL 4 describes a pedestrian simulation device and the like. In a technique described in PTL 4, a personal space for ensuring spacing between anthropomorphic models is formed for a anthropomorphic model that travels on a link connecting two points, and, when overlapping of personal spaces is detected, an avoidance direction and a position of the anthropomorphic model are determined.

PTL 5 describes a traffic flow simulation device and the like. The traffic flow simulation device described in PTL 5 determines a position in the post-movement place of a moving object that moves along a passage including one or more lanes, according to whether or not an obstacle is present ahead.

CITATION LIST

Patent Literature

[PTL 1] Japanese Unexamined Patent Application Publication No. 2009-19920

[PTL 2] Japanese Unexamined Patent Application Publication No. 2014-23548

[PTL 3] Japanese Unexamined Patent Application Publication No. H4-75199

[PTL 4] Japanese Unexamined Patent Application Publication No. 2009-301295

[PTL 5] Japanese Unexamined Patent Application Publication No. 2008-129874

SUMMARY OF INVENTION

Technical Problem

In simulation for simulating the appearance of moving of a pedestrian or the like, it is preferable that appearances of moving of a large number of pedestrians are appropriately expressed on the basis of their behavioral characteristics.

In the technique described in PTL 1, no consideration is given to influence between modeled pedestrians in path selection.

In the cellular automaton as described in PTL 2, characteristics (moving speed or the like) of models are not capable of being set so as to be mutually different. Further, in the real world, a road may extend in various directions, and a crossing may not have a square shape. In such a case, a shape of a road may not be correctly reproduced in the cellular automaton that uses only cells of an identical shape.

In the techniques described in PTLs 3, 4, and 5, when an appearance of moving of a pedestrian or the like is reproduced, positions of or other information on many other pedestrians or the like existing around the pedestrian or the like need to be regarded as targets for computation. In other words, in the above-described techniques described in PTLs 3 to 5, simulating an appearance of moving of a pedestrian or the like requires a large computational load.

The present invention has been made in light of the above-described problems, and a main object of the present invention is to provide a simulation device and the like that reduce a load for computing behavior of a pedestrian or the like while suppressing inaccuracy in simulation.

Solution to Problem

A simulation device according to one aspect of the present invention includes: candidate selection means for selecting, based on a position of a moving object model that is a virtual moving object positioned within a virtual map including a plurality of cells, one or more of the plurality of cells, as candidates for a post-movement place of the moving object model; margin level computation means for computing, for each candidate of the candidates, a margin level that represents a degree of a margin of the each candidate for newly accepting the moving object model; and cell determination means for determining the post-movement place from among the candidates, based on the margin level and a reference direction associated with the moving object model.

A simulation method according to one aspect of the present invention includes: selecting, based on a position of a moving object model that is a virtual moving object positioned within a virtual map including a plurality of cells, one or more of the plurality of cells, as candidates for a post-movement place of the moving object model; computing, for each candidate of the candidates, a margin level that represents a degree of a margin of the each candidate for newly accepting the moving object model; and determining the post-movement place from among the candidates, based on the margin level and a reference direction associated with the moving object model.

A program according to one aspect of the present invention causes a computer to perform: candidate selection processing for selecting, based on a position of a moving object model that is a virtual moving object positioned within a virtual map including a plurality of cells, one or more of the plurality of cells, as candidates for a post-movement place of the moving object model; margin level computation processing for computing, for each candidate of the candidates, a margin level that represents a degree of a margin of the each candidate for newly accepting the moving object model; and cell determination processing for determining the post-movement place from among the candidates, based on the margin level and a reference direction associated with the moving object model.

Advantageous Effects of Invention

The present invention is able to reduce a load for computing behavior of a pedestrian or the like while suppressing inaccuracy in simulation.

EXAMPLE EMBODIMENT

In the following, example embodiments of the present invention are described in detail with reference to the drawings.

First Example Embodiment

First, a first example embodiment of the present invention is described.

<Configuration>

Figure 1:
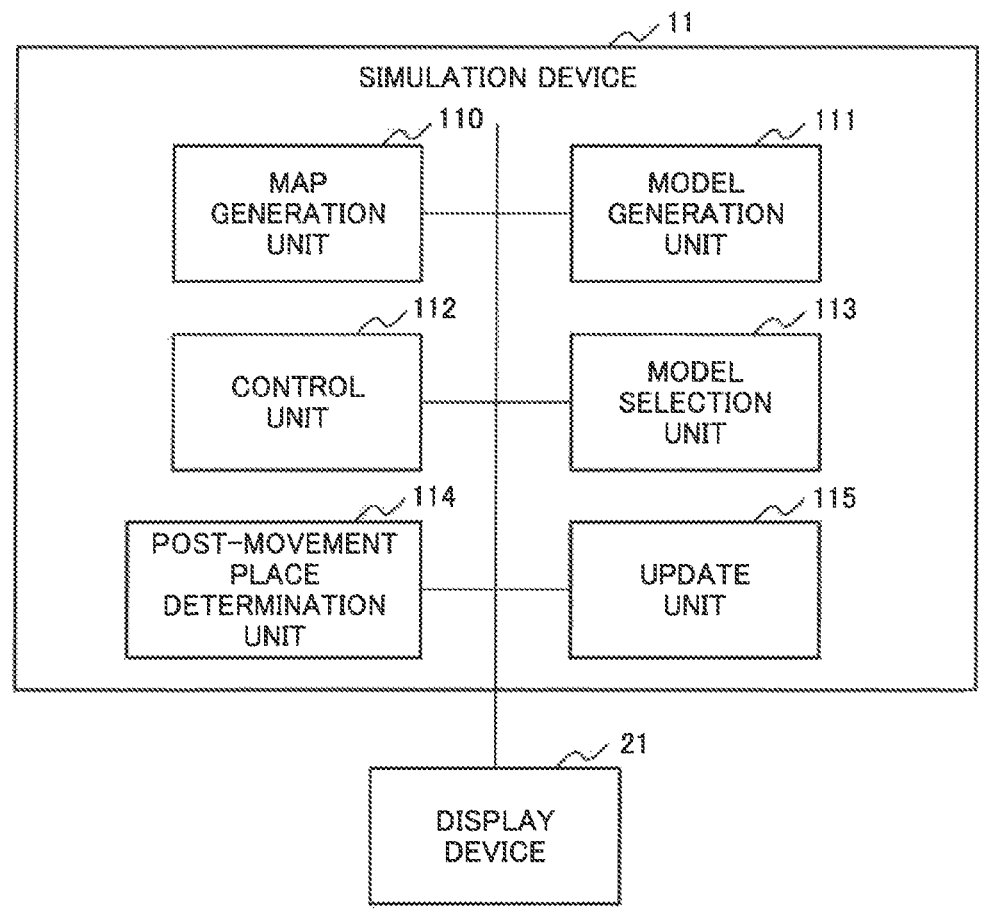
FIG. 1 is a block diagram illustrating a configuration of a simulation device according to a first example embodiment of the present invention.

FIG. 1 is a block diagram illustrating a configuration of a simulation device 11 according to the first example embodiment.

As illustrated in FIG. 1, the simulation device 11 includes a map generation unit 110, a model generation unit 111, a control unit 112, a model selection unit 113, a post-movement place determination unit 114, and an update unit 115. Further, the simulation device 11 is communicably connected with a display device 21.

===Map Generation Unit 110===

The map generation unit 110 generates a map 50.

(Map 50)

The map 50 is described next.

The map 50 is a virtual area that defines a range in which a moving object model 54 exists (is able to move) in simulation performed by the simulation device 11. The moving object model 54 will be described later in detail.

Figure 2:
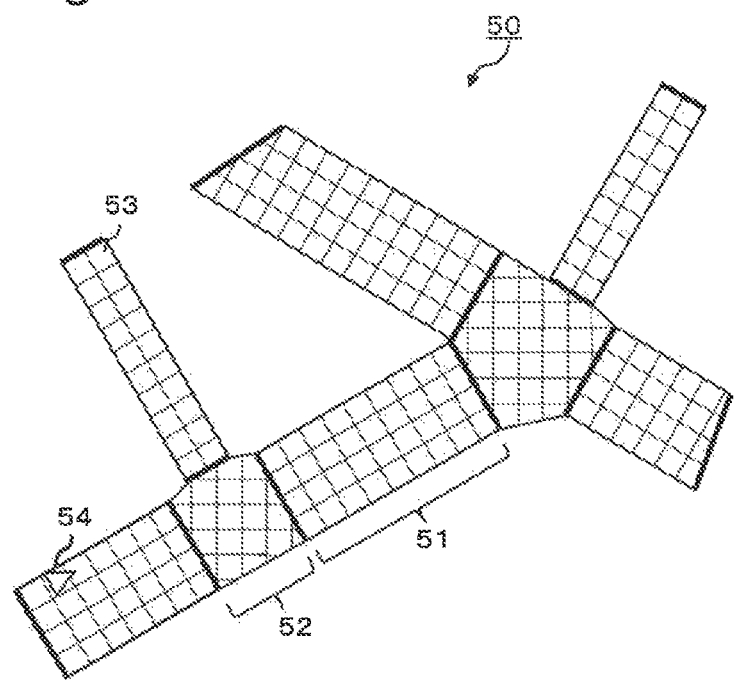
FIG. 2 is a diagram illustrating an example of a map for use in simulation.

FIG. 2 is a diagram illustrating one example of the map 50. As in FIG. 2, for example, the map 50 simulates a shape of a road or a crossing that is a target for simulation. The map 50 is an aggregate of a plurality of cells 53 (virtual small divisions). In FIG. 2, each one of small divisions demarcated by lines is the cell 53.

In FIG. 2, one of the moving object models 54 to be described later is represented by an isosceles triangle. In FIG. 2, a direction of a vertex formed by two sides of an equal length of the isosceles triangle (a direction from a centroid to the vertex) represents a direction in which the moving object model 54 faces.

The map 50 has one or more divisions each of which includes one or more cells 53. In the example of the present example embodiment, the divisions include two types: a section 51 and an intersection 52. In the example illustrated in FIG. 2, the map 50 is constituted of six sections 51 (described later) and two intersections 52 (described later). However, in another example embodiment, the map 50 may not include either one of the section 51 or the intersection 52.

In FIG. 2, a boundary between the section 51 and the intersection 52 is represented by a bold line. Further, a boundary between the section 51 and outside a region of the map 50 (outside) and a boundary between the intersection 52 and the outside are also represented by bold lines. In the present example embodiment, the above-described boundary is referred to as a boundary line. In other words, a boundary line in the present example embodiment is a line that represents a boundary between the section 51 and the intersection 52, the section 51 and the outside, or the intersection 52 and the outside. For the sections 51 and the intersections 52, a boundary line is understood as an entrance and an exit for a model of a moving object (pedestrian or the like). Note that, a line that is included in a contour of the section 51 or the intersection 52 and is not represented by a bold line is understood as a line across which the moving object model 54 does not come in or out. This line is not referred to as a boundary line in the present example embodiment. Incidentally, it is considered that this line simulates, for example, a wall or a fence.

(Section 51)

Figure 3:
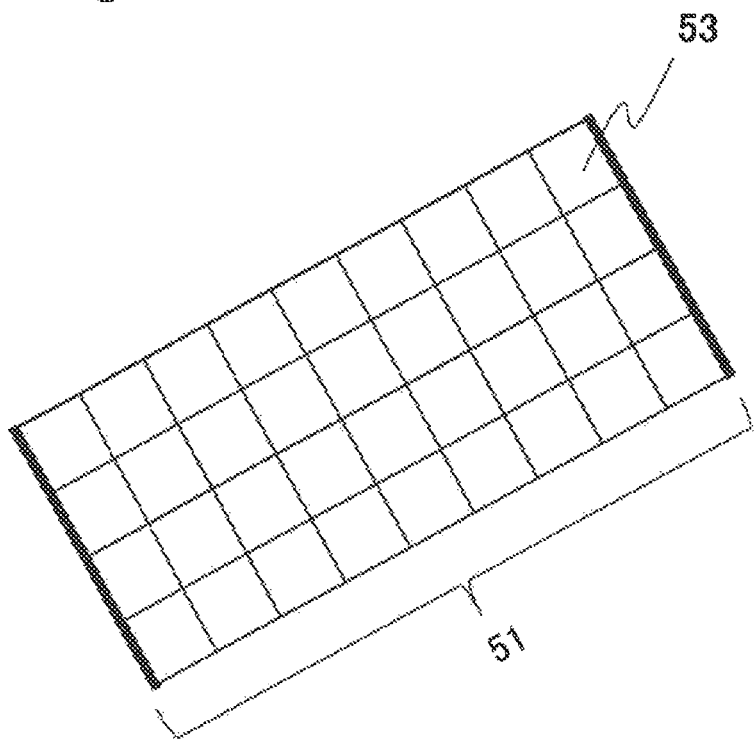
FIG. 3 is a diagram illustrating an example of a section included in a map.

FIG. 3 is a diagram illustrating one example of the section 51. The section 51 is an aggregate of one or more cells 53 that has two boundary lines. In FIG. 3, the two boundary lines are represented by bold lines. The section 51 is equivalent to, as one example, a direct road (unbranched road) linking between crossings in the real world. The length of the section 51 may be determined according to a distance or the like between two points linked by a road in a real world. In the example illustrated in FIG. 3, the section 51 is an aggregate of the square cells 53 arrayed in such a manner as to form a rectangle.

One road may be represented by a plurality of sections 51. In particular, when a road to be simulated is not straight, the map generation unit 110 may represent the road by using a plurality of sections 51 and intersections 52.

(Intersection 52)

The intersection 52 is an aggregate of one or more cells 53 that has two or more boundary lines. The section 51 may be connected with a boundary line of the intersection 52. In other words, the intersection 52 is equivalent to, as one example, a crossing or the like where a plurality of roads intersect in the real world.

The intersection 52 may have a boundary line with outside a region of the map 50.

Figure 4:
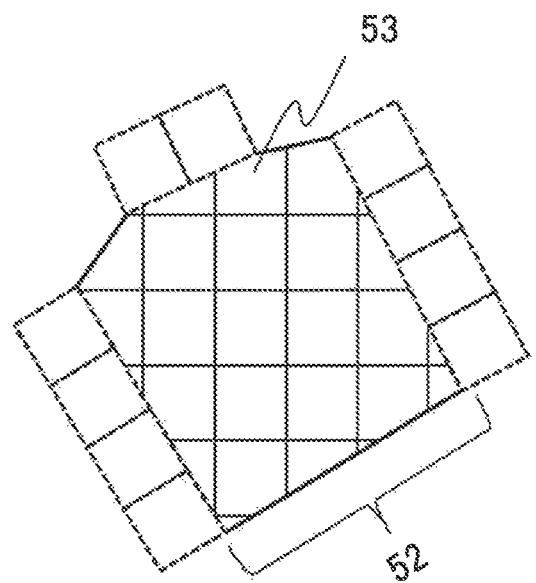
FIG. 4 is a diagram illustrating an example of an intersection included in a map.

A shape of the intersection 52 is not limited to a rectangle. FIG. 4 is a diagram illustrating an example of the intersection 52. As one example, the shape of the intersection 52 may accords to a shape of a real crossing or the like simulated by the intersection 52, as illustrated in FIG. 4. In FIG. 4, a boundary line with which the section 51 is connected, and a part of the section 51 are illustrated by dashed lines. As in FIG. 4, the intersection 52 may have a polygonal shape that includes a side the length of which is equal to a width of the section 51 that is connected with the intersection 52.

(Cell 53)

The cells 53 are virtual small divisions associated with a predetermined range in the real world. Each of the cells 53 may represent a space of such an extent that may include one or a plurality of pedestrians or the like, in a real sidewalk associated with the section 51 or the intersection 52. For example, a width and a length of each of the cells 53 may be associated with a space of one meter square in a real sidewalk associated with the section 51 or the intersection 52.

An array of the cells 53 is, for example, an array in which a region of the section 51 or the intersection 52 is filled with regions of an identical shape (a square in the examples in FIGS. 2 and 3) except for a part of the region.

A shape of the cell 53 in the present example embodiment is a square-based shape, as illustrated in FIG. 2. In other words, when the cell 53 is a cell that does not have a border with an outer periphery of the section 51 or the intersection 52, the cell 53 is a square with equal vertical and horizontal lengths. When the cell 53 is a cell that has a border with an outer periphery of the section 51 or the intersection 52, the cell 53 has a partially missing square shape which is shaped according to a shape of the section 51 or the intersection 52. In this manner, using cells of various shapes rather than using only cells of an identical shape enables the map generation unit 110 to generate the map 50 more appropriately simulating a shape in the real world.

In another example embodiment, a shape of each of the cells 53 may be modified as appropriate. For example, the cell 53 may have a rectangle-based, parallelogram-based, or hexagon-based shape.

Sections 51 and intersections 52 may differ in an array direction of the cells 53 (in other words, a direction of sides of the cells 53, or a direction of the adjacent cells 53). For example, when generating the section 51, the map generation unit 110 arrays the cells 53 in order for them to be along a direction of, for example, the section 51 (in other words, a direction from one boundary line toward another boundary line). "To be along" a certain direction means a manner such that, for example, at least one of line segments linking between centroids of the adjoining cells 53 is parallel with the certain direction. In particular, when the section 51 is rectangular, the map generation unit 110 may array the cells 53 of a square-based shape in a lattice shape (in such a manner that the adjacent cells 53 share a side) in a direction of the section 51, as illustrated in FIG. 3. Although an array other than the array illustrated in FIG. 3 is possible, arraying the cells 53 in a lattice shape has an advantage that specification of a range of each cell 53 is facilitated.

When forming the intersection 52, the map generation unit 110 aligns the cells 53 in such a manner as to fill a plane of the intersection 52. Arraying the cells 53 included in the intersection 52 in a lattice shape also facilitates specification of a range of the cell 53. At this time, a direction of any side of the cell 53 may not match a direction of a boundary line or an edge of the intersection 52. The map generation unit 110 may array the cells 53, for example, in such a direction that entails the least computational load for the simulation device 11. For example, when a coordinate system on which the entire map 50 is based is a coordinate system defined by a vertical axis and a horizontal axis, the map generation unit 110 may array the cells 53 in such a manner as to be aligned in a vertical direction and a horizontal direction.

A shape and a size of the cell 53 may vary for each section 51 and each intersection 52.

Hereinafter, the cell 53 might be described by omitting a reference sign ("53"). However, a "cell" with no reference sign also indicates the above-described cell 53 unless specifically described otherwise. Further, a reference sign other than "53" might be attached to a "cell" for illustrative purposes.

The above-described map 50 may be determined on the basis of, for example, a real traffic route such as a sidewalk that is a target for simulation, a connection relation thereof, or the like. The map generation unit 110 may generate the map 50 on the basis of a map, a photograph, or the like of a real road. The map generation unit 110 may generate the map 50 on the basis of data of a virtual road network and the like.

When simulation is performed for a partial section of a single road or one particular crossing, the map generation unit 110 may generate the map 50 including only either one of the section 51 or the intersection 52.

===Model Generation Unit 111===

The model generation unit 111 generates the moving object model 54 associated with the map 50.

(Moving Object Model 54)

The moving object model 54 is described.

The moving object model 54 is a model for simulating an appearance of moving of a moving object that moves along a road or the like simulated by the map 50. The moving object is, for example, a pedestrian. The moving object may be a bicycle or another vehicle. The moving object model 54 is a virtual entity for expressing behavior reflecting a characteristic of a moving object. The moving object model 54 is associated with a position on the map 50. The moving object model 54 may be represented by a triangle as in FIG. 2.

Each of a plurality of moving object models 54 are distinguished from one another as individual moving object models 54. Each of the moving object models 54 is associated with information representing a state. A state of the moving object model 54 represents a characteristic of a moving object simulated by the moving object model 54. A state of the moving object model 54 is, for example, a position, a destination, a reference direction, a step distance, a size, and the like of the moving object model 54. Meanings of these terms will be described later.

When the simulation device 11 starts a simulation, the model generation unit 111 generates the moving object model 54 as initial setting. The model generation unit 111 may generate any number of the moving object models 54. For example, a user may designate the number of the moving object models 54, or the model generation unit 111 may determine, on the basis of measured data or the like, a realistic number as the number of the moving object models 54.

When generating the moving object models 54, the model generation unit 111 determines states of the moving object models 54 to be generated. A detail of a state and an example of a way of determining a state are as follows.

(Position)

A "position of the moving object model 54" is specifically a position in the map 50 at which the moving object model 54 is considered to exist. A position of the moving object model 54 may be any position in the map 50 at a time of initial setting. The model generation unit 111 may associate, as a position of the moving object model 54, for example, a randomly determined position within the map 50 with the moving object model 54. The model generation unit 111 may associate, as a position of the moving object model 54, for example, a position based on an instruction from a user via an interface or the like with the moving object model 54. A position is represented by, for example, coordinates. Hereinafter, associating a position determined by the model generation unit 111 with the moving object model 54 is also referred to as "arranging" the moving object model 54.

When initially arranging the moving object model 54 in the intersection 52, the model generation unit 111 may arrange the moving object model 54 as follows. At first, among the sections 51 connected with the intersection 52, the model generation unit 111 sets, (for example, by means of random selection) a before-entry section 51 (i.e., the section 51 in which the moving object model 54 is supposed to have been) and an after-passage section 51 (i.e., the section 51 into which the moving object model 54 is supposed to step next after passing through the intersection 52). Then, the model generation unit 111 sets an ante-entry cell (i.e., a cell in which the moving object model 54 is supposed to have been) in the before-entry section 51.

Figure 5:
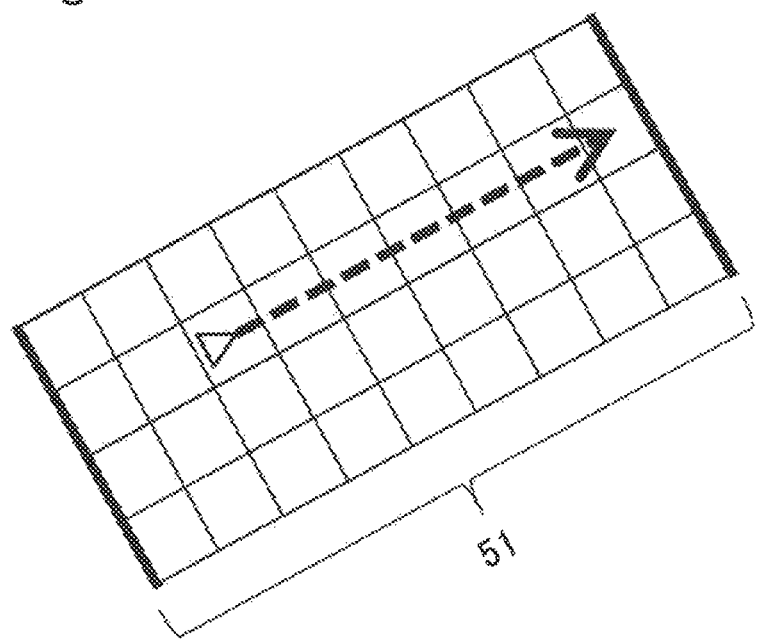
FIG. 5 is a diagram illustrating an example of a reference direction of a moving object model positioned in a section.

Further, the model generation unit 111 sets a post-passage cell (i.e., a cell toward which the moving object model 54 is supposed to move) in the after-passage section 51. Then, the model generation unit 111 arranges the moving object model 54 at any position on a virtual line segment linking a midpoint of a border between the ante-entry cell and the intersection 52 with a midpoint of a border between the post-passage cell and the intersection 52, as illustrated in FIG. 5.

The model generation unit 111 may arrange a plurality of moving object models 54 at an identical position.

In the simulation device 11 according to the present example embodiment, when processing is executed repeatedly, the model generation unit 111 may generate a new moving object model 54 on the map 50 in the middle of the repeatedly executed processing. In this case, the model generation unit 111 arranges the moving object model 54 on a boundary line between the map 50 and an outside region of the map 50.

(Destination)

A destination is a place set as a place to be reached by the moving object model 54. In the present example embodiment, a destination is any of boundary lines between the map 50 and an outside region of the map 50. The model generation unit 111 may set any destination for the moving object model 54 to be generated.

(Reference Direction)

A reference direction is a direction serving as a reference for a movement direction, in determining a post-movement place by the moving object model 54. As described later, the post-movement place determination unit 114 determines a post-movement place of the moving object model 54 on the basis of a reference direction. Specifically, the post-movement place determination unit 114 determines a post-movement place of the moving object model 54, for example, in a range between a direction deviated by a predetermined angle rightward with respect to a reference direction and a direction deviated by a predetermined angle leftward. A reference direction is associated with, for example, a direction to which a moving object such as a person simulated by the moving object model 54 is directed. Setting a reference direction indicates that a moving object determines a course by using a facing direction as a reference.

When the moving object model 54 is arranged in the section 51, the model generation unit 111 employs, as a reference direction of the moving object model 54, for example, a direction of the section 51, in other words, a direction from either one of boundary lines of the section 51 toward another of the boundary lines. More specifically, the model generation unit 111 employs, as a reference direction, a direction toward a boundary line through which the shortest path from a current position of the moving object model 54 to a destination first passes. In the example illustrated in the present example embodiment, an array of the cells 53 lies along a direction of the section 51, and thus, a reference direction lies along one of array directions of the cells 53, as illustrated by an arrow in FIG. 5.

As a modification example, the model generation unit 111 may employ, as a reference direction, a direction toward a cell that is passed through when the shortest way to a destination is taken, among cells including a part of a boundary line.

Figure 6:
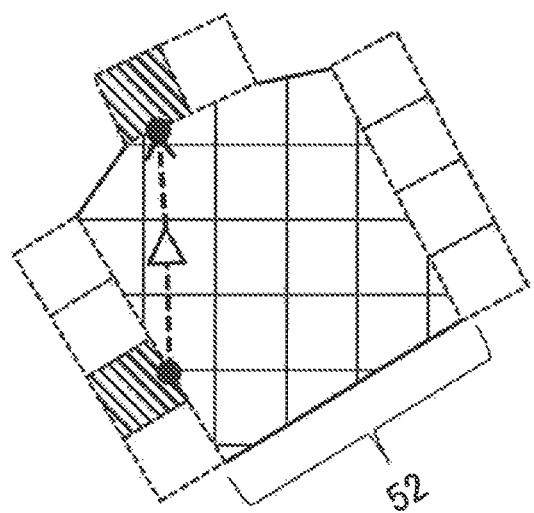
FIG. 6 is a diagram illustrating an example of a reference direction of a moving object model positioned in an intersection.

When the moving object model 54 is arranged in the intersection 52 and when an ante-entry cell and a post-passage cell have been already set (for example, in determining a position of the moving object model 54), the model generation unit 111 may employ, as a reference direction of the moving object model 54, for example, a direction toward the post-passage cell. Specifically, the model generation unit 111 may set a reference direction to a direction from a midpoint of a border between the ante-entry cell and the intersection 52 toward a midpoint of a border between a post-passage cell and the intersection 52, as illustrated in FIG. 6.

When the moving object model 54 is arranged in the intersection 52 and when an ante-entry cell and a post-passage cell have not been set in determining a position, the model generation unit 111 may (for example, randomly) set an ante-entry cell and a post-passage cell to appropriate positions. Then, the model generation unit 111 may set a reference direction of the moving object model 54 to a direction from the ante-entry cell toward the post-passage cell. Alternatively, the model generation unit 111 may set a reference direction to a direction from a current position of the moving object model 54 toward a midpoint of a border between the post-passage cell and the intersection 52.

(Step Distance)

A step distance is the maximum distance that the moving object model 54 may move per phase. In other words, a step distance is associated with a distance traveled per unit time by a pedestrian or the like in the real world. A phase will be described later in detail.

The step distance may be set to an appropriate distance, on the basis of a period of time equivalent to one phase and a moving speed of a pedestrian or the like simulated by the moving object model 54. For example, a step distance may be a length of a side of a standard cell. Each of the step distances may be set to an identical value for all the moving object models 54, or step distances may be set to different values for moving object models 54.

(Size)

A size of the moving object model 54 is an index of an area of a region occupied by the moving object model 54 on the map 50. A size is set according to, for example, an area occupied, on a real sidewalk, by a pedestrian or the like associated with each of the moving object models 54. An identical size may be set for all the moving object models 54, or different sizes may be set depending on the moving object models 54. For example, a size of the moving object model 54 simulating a non-handicapped adult may be set to 1.0, and a size of the moving object model 54 simulating a wheelchair user may be set to 1.5.

The model generation unit 111 may acquire the state of each moving object model 54 through, for example, an input unit, a communication network, or the like (not-illustrated). Further, the model generation unit 111 may acquire the state of each moving object model 54 stored in advance, from a memory, a disk device, or the like (not-illustrated).

Next, functions of the control unit 112, the model selection unit 113, the post-movement place determination unit 114, and the update unit 115 of the simulation device 11 are described. The control unit 112, the model selection unit 113, the post-movement place determination unit 114, and the update unit 115 operate on the basis of information relating to the map 50 and the moving object model 54 that are generated by the map generation unit 110 and the model generation unit 111. Note that, information relating to the map 50 and the moving object model 54 may be stored in a not-illustrated storage unit, the update unit 115, or the like.

===Control Unit 112===

The control unit 112 controls an operation of each unit of the simulation device 11.

Simulation by the simulation device 11 is performed over one or a plurality of phases. A phase is a unit of repetitive processing relating to a simulation. For example, the control unit 112 completes a simulation for all the moving object models 54 in a certain phase, and thereafter starts a simulation in a next new phase.

In the present example embodiment, the simulation device simulates, through processing in one phase, a motion of a moving object in a period of time of one predetermined time unit. This predetermined time unit is determined as appropriate, in such a manner that behavior of a pedestrian or the like simulated by the moving object model 54 is appropriately expressed, according to a size of the map 50, a speed of the moving object model 54, the number of the moving object models 54, or the like. As one example, when the moving object model 54 is associated with a pedestrian or the like, a period of time required when the pedestrian travels one or more steps along a real road or the like is determined as the above-described predetermined time unit. The predetermined time unit is, for example, one second.

An appearance of moving of the moving object model 54 is simulated by repeatedly performing a simulation in each phase.

The number of phases or a period of simulation desired by a user may be set for the simulation device 11 by the user. The control unit 112 may determine, according to settings, whether to repeat processing. For example, when the above-described predetermined time unit is one second, and one hour (in other words, 3600 seconds) is set as a period of simulation desired by a user, the control unit 112 controls an operation of the simulation device 11 such that simulations are repeated until simulations are performed under 3600 phases.

===Model Selection Unit 113===

The model selection unit 113 selects one moving object model 54 in the map 50. A motion of the selected moving object model 54 is simulated, as a target for simulation, by an operation of each unit to be described below.

When there are a plurality of moving object models 54, the model selection unit 113 sequentially selects one of the moving object models 54. The model selection unit 113 selects the moving object model 54 in such a manner that simulation is performed an equal number of times for each of the moving object models 54.

For example, each of the moving object models 54 is selected once in one phase. The model selection unit 113 selects, for example, one of the yet unselected moving object models 54 in a current phase. A method of selecting one moving object model 54 may be a method based on any algorithm. For example, the model selection unit 113 may randomly select one moving object model 54. Besides the above, the model selection unit 113 may select one moving object model 54 on the basis of any order or a procedure that is determined according to the map 50 or a characteristics or the like of each of the moving object models 54. For example, the model selection unit 113 may select the moving object model 54 in order from the moving object model 54 at a short distance to a destination.

===Post-Movement Place Determination Unit 114===

The post-movement place determination unit 114 determines a post-movement place of the moving object model 54 selected by the model selection unit 113. An post-movement place is, in other words, a position after movement in a current phase. A detail of the post-movement place determination unit 114 will be described later.

===Update Unit 115===

The update unit 115 updates states of all the moving object models 54. A type of a state to be updated is, for example, a position, a reference direction, and so on.

For example, the update unit 115 updates (overwrites) a position of the moving object model 54 by using a position determined by the post-movement place determination unit 114. Note that, when a determined position of the moving object model 54 is outside a range of the map 50, information on the moving object model 54 may be deleted.

For example, the update unit 115 determines a reference direction of the moving object model 54 on the basis of a new position of the moving object model 54. A method of determining a reference direction may be similar to the above-described method of determining a reference direction by the model generation unit 111.

The update unit 115 may change another type of a state of the moving object model 54. For example, the update unit 115 may change a distance traveled by the moving object model 54 per one step according to an environment around the moving object model 54.

A position of the moving object model 54 after update by the update unit 115 is equivalent to a position of the moving object model 54 at a time point later by one predetermined time unit than a time point associated with a position before the update. In other words, updating a position of the moving object model 54 by the update unit 115 enables expressing movement of the moving object model 54 every unit time. Further, repeatedly updating a position of the moving object model 54 by the update unit 115 enables expressing an appearance of moving of the moving object model 54.

The update unit 115 may cause the model generation unit 111 to generate a new moving object model 54 on the map 50, at a time when a simulation for a current phase is ended and a simulation for a next phase is started. For example, generating the moving object model 54 by the model generation unit 111 on a boundary line between the map 50 and an outside region of the map 50 enables expressing a moving object that has flowed in from the outside of the map 50.

The update unit 115 may output an updated position of the moving object model 54 to the display device 21, a not-illustrated communication network, or the like. Further, the update unit 115 may output a state of the moving object model 54 to any not-illustrated memory, any not-illustrated disk device, or the like.

===Display Device 21===

The display device 21 displays the map 50 and the moving object model 54. The display device 21 is, for example, a liquid crystal display. The display device 21 acquires, from the simulation device 11, information on the map 50 and information of the moving object model 54 on the map 50 such as the position, the reference direction and so on.

For example, the display device 21 may display, on a screen for displaying the map 50, each cell in which a moving object model 54 is positioned, in a mode different from that of a cell in which a moving object model 54 is not positioned. Alternatively, the display device 21 may draw an isosceles triangle at a position of the moving object model 54 on the map 50.

The display device 21 updates, for example, a display content each time a position of the moving object model 54 is updated. This enables a person who sees display of the display device 21 to recognize a position and an appearance of moving of the moving object model 54.

One Example of Simulation Flow

Figure 7:
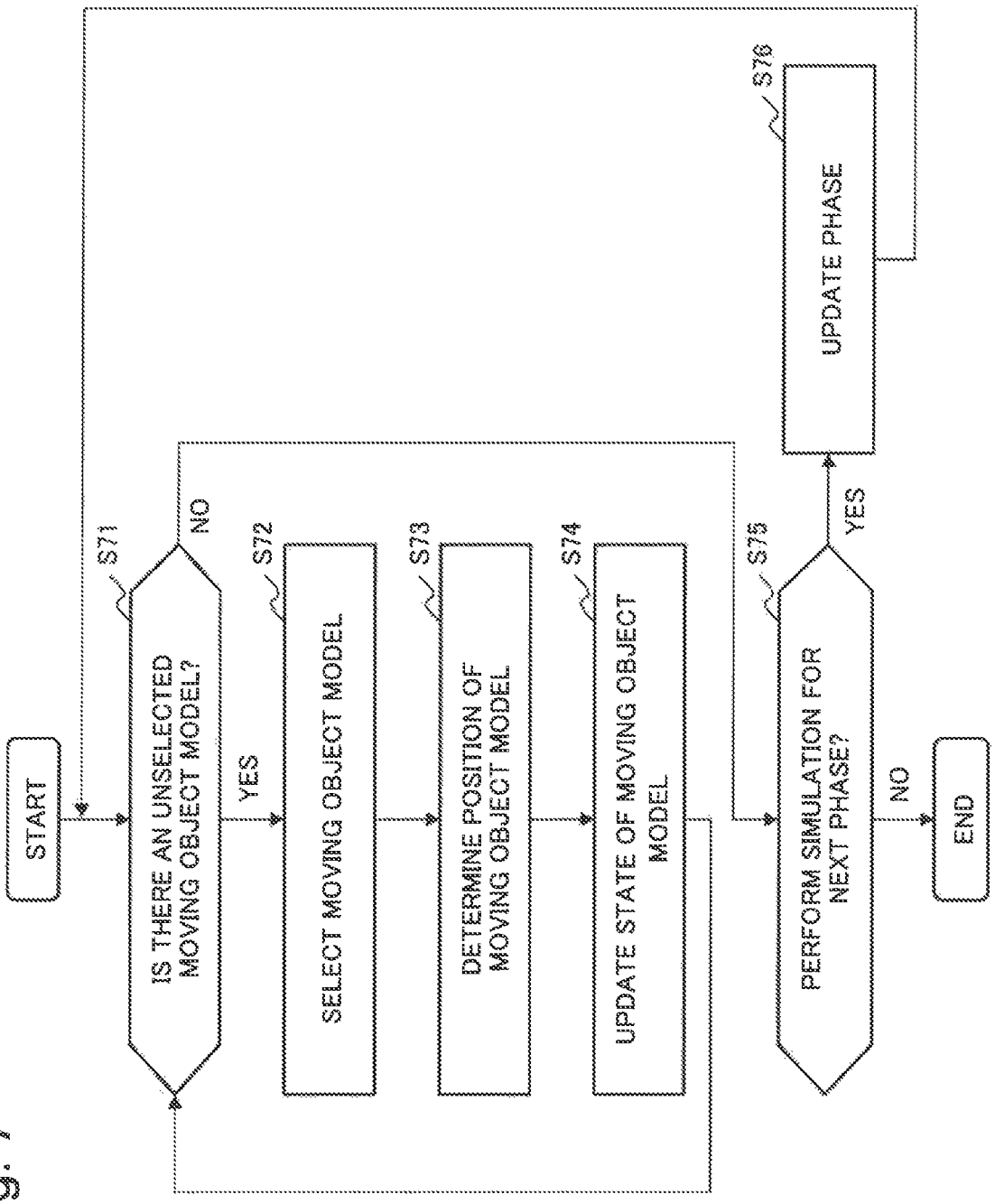
FIG. 7 is a flowchart illustrating one example of an operation flow for the simulation device according to the first example embodiment.

A flow of a simulation performed by the simulation device 11 according to the present example embodiment is described in accordance with a flowchart in FIG. 7.

A simulation is performed on the basis of the map 50 generated by the map generation unit 110. Upon starting of a simulation, the model generation unit 111 generates one or more moving object models 54. Then, the control unit 112 starts a phase, and the following processing is executed for each phase.

The model selection unit 113 checks whether there is an unselected moving object model(s) 54 in the phase (Step S71). When there is an unselected moving object model 54 (YES in Step S71), the model selection unit 113 selects one of the unselected moving object models 54 (Step S72). Then, when the moving object model 54 is selected, the post-movement place determination unit 114 determines a post-movement place, in other words, a position of the selected moving object model 54 (Step S73). Then, the update unit 115 updates the state of the moving object model 54 (Step S74).

Thereafter, the model selection unit 113 again selects an unselected moving object model 54 (Step S72 via Step S71). In this manner, the processing of Steps S71 to S74 is repeated until all the moving object models 54 are selected and positions are updated.

When there is no unselected moving object model 54 (NO in Step S71), the operation of the simulation device 11 transitions to Step S75. The display device 21 may display the updated position of the moving object model 54 at this time.

In Step S75, the control unit 112 determines whether to perform a simulation for a next phase. When determining to perform a simulation for a next phase (YES in Step S75), the control unit 112 updates the phase (Step S76). Updating the phase means controlling each unit such that a simulation is performed for a next phase. After the phase is updated, the processing of Steps S71 to S75 is performed again. When determining not to perform a simulation for a next phase (NO in Step S75), the control unit 112 ends the processing of the simulation device 11. The control unit 112 may cause the display device 21 to perform display indicating that the simulation has been ended.

Another Example of Simulation Flow

Figure 8:
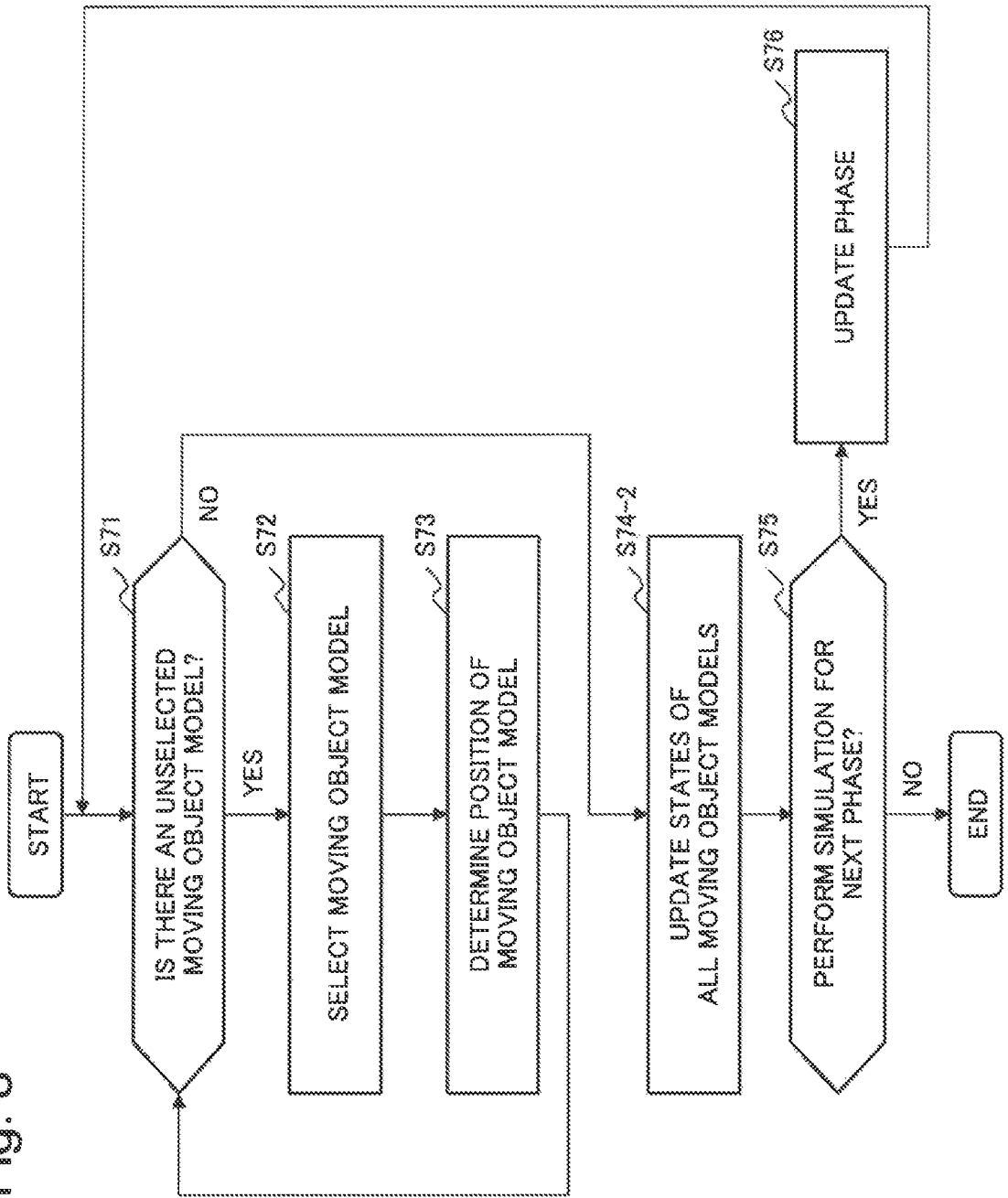
FIG. 8 is a flowchart illustrating another example of an operation flow for the simulation device according to the first example embodiment.

Update of states of the moving object models 54 may be performed at a time after all the moving object models 54 are selected in a phase. A flow of such an operation is illustrated in FIG. 8.

As to the Steps S71 to S73, operations are similar to the operations illustrated in FIG. 7. However, in an example illustrated in FIG. 8, the moving object model 54 is not updated immediately after Step S73. A position of the moving object model 54 determined in Step S73 may be stored by a not-illustrated storage unit, the post-movement place determination unit 114, or the like.

When positions of all the moving object models 54 are determined, the operation of the simulation device 11 transitions to Step S74-2 via determination of NO in Step S71. In Step S74-2, the update unit 115 updates states of all the moving object models 54.

Then, when a simulation for a next phase is performed (YES in Step S75), the control unit 112 updates a phase (Step S76). Note that, at a time of updating a phase, the model generation unit 111 may generate a new moving object model 54 on a boundary line between the map 50 and the outside of the map 50. After a phase is updated, the processing of Steps S71 to S75 is performed again. When a simulation for a next phase is not performed (NO in Step S75), the simulation device 11 ends the processing.

With the operation as described above, the simulation device 11 updates a position of the moving object model 54 and expresses an appearance of moving of the moving object model 54 in the map 50.

===Control Structure of Post-Movement Place Determination Unit 114=

Next, a method of determining, by the post-movement place determination unit 114, a position in the post-movement place of the selected moving object model 54 is described. The post-movement place determination unit 114 determines a position in the post-movement place on the basis of a position of the selected moving object model 54, a reference direction, and a margin level of a cell that may be a cell corresponding to the post-movement place of the moving object model 54 (a "margin level" will be described later).

Figure 9:
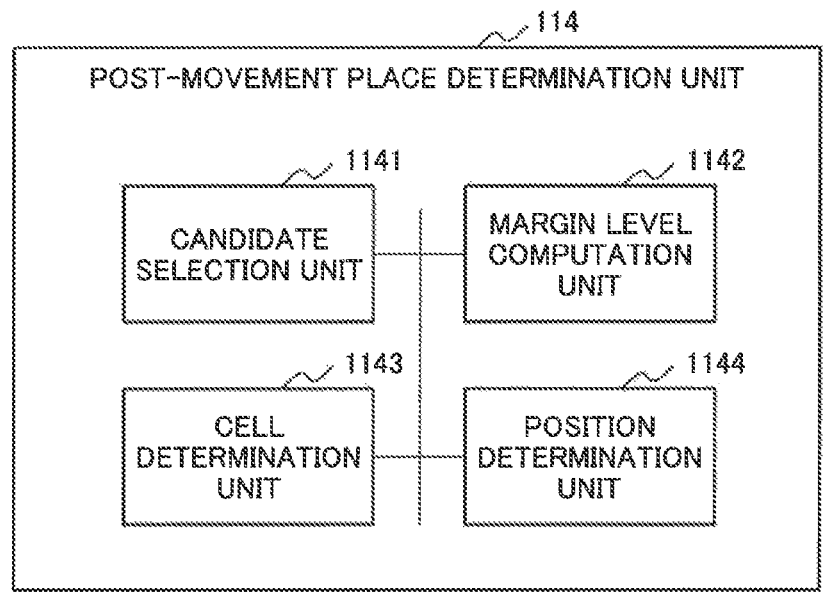
FIG. 9 is a block diagram illustrating a control structure of a post-movement place determination unit according to the first example embodiment.

Specifically, the post-movement place determination unit 114 includes, as illustrated in FIG. 9, for example, a candidate selection unit 1141, a margin level computation unit 1142, a cell determination unit 1143, and a position determination unit 1144, and determines a position in the post-movement place of the moving object model 54 through processing of these units.

==Candidate Selection Unit 1141==

The candidate selection unit 1141 selects a candidate for a cell corresponding to the post-movement place to which the moving object model 54 moves next. The candidate selection unit 1141 selects a candidate such that the moving object model 54 is able to simulate a motion reflecting a characteristic of a moving object.

For example, the candidate selection unit 1141 selects, as a candidate, a cell having a region included in a predetermined range based on the moving object model 54. This predetermined range is, for example, a range that may be reached by the moving object model 54 in a current phase. The predetermined range may be set in consideration of, for example, a range that can be seen by a moving object simulated by the moving object model 54.

Figure 10:
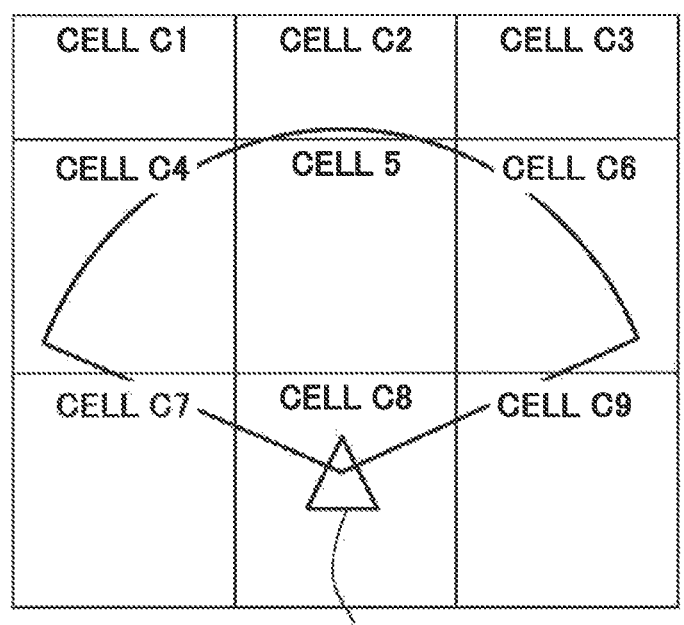
FIG. 10 is a diagram illustrating an example of a range that may be a post-movement place of a moving object model.

For example, a predetermined range is a range defined by a circular sector with a center at a position of the moving object model 54 and an axis of symmetry in a reference direction (in other words, a circular sector with a central angle divided equally by a reference direction), as illustrated in FIG. 10. In an example illustrated in FIG. 10, a radius of this circular sector is a step distance, and a central angle is 120 degrees. The candidate selection unit 1141 selects, as a candidate, a cell including a region in this range. In the example illustrated in FIG. 10, a cell having a region included in this circular sector is cells C2, C4, C5, C6, C7, C8, and C9. Thus, the candidate selection unit 1141 selects these seven cells as candidates.

Moving object models 54 may differ in methods of determining a predetermined range.

The candidate selection unit 1141 may limit a candidate cell to a cell (cell C8) in which the moving object model 54 is currently positioned and an adjacent cell to the cell (a cell sharing a vertex with the cell also may be a candidate).

When a range that may be reached by the moving object model 54 includes a portion of a boundary line that is a destination, the moving object model 54 may be regarded as reaching the destination in this phase. In other words, the candidate selection unit 1141 may not select a candidate as for the moving object model 54, and processing described below may not be applied to the moving object model 54. Then, for example, outside a range of the map 50 may be associated as a position of the moving object model 54. When outside a range of the map 50 is associated as a position, the update unit 115 may regard the moving object model 54 as having moved out of the map 50, and may erase the moving object model 54.

==Margin Level Computation Unit 1142==

The margin level computation unit 1142 computes a margin level of each of candidate cells. A margin level of a cell is a degree of a margin of the cell for newly accepting a moving object model. A margin level of a cell may be information (for example, a numerical value) representing a degree of a margin for newly accepting a moving object model in the cell. As a value representing a margin level of a cell becomes larger, the value indicates that the cell accepts a moving object model more readily. A margin level of a cell can be said as an index of easiness in stepping into a region with which the cell is associated in the real world.

A margin level of a cell is based on, for example, an extent of the cell, or an extent of an occupied region in a region of the cell. An occupied region is, for example, a region occupied by the moving object model 54 having a region included in a range of a region of the cell.

For example, in computing a margin level, the margin level computation unit 1142 uses values of a "capacity" and a "usage amount" of the cell as a basis.

A "capacity" is, for example, an index of an extent of the cell. For example, a capacity may be set on the basis of how many moving object models 54 having a value of a size of 1.0 can be accommodated within the cell. A capacity may be a decimal. A capacity of each cell may be set to a value depending on an area of a region with which the cell is associated. For example, when a square cell is associated with a range having an area of one square meter with one side length of one meter, the capacity of the square cell may be set to 2.0. In this time, a capacity of a cell associated with a region having an area of 0.5 square meters with a partially missing square shape may be set to 1.0.

A "usage amount" is a size of a region considered to be occupied by the moving object model 54 in the cell. The margin level computation unit 1142 may compute, as a usage amount, for example, a sum total of sizes of the moving object models 54 positioned within a region of the cell. When all the moving object models 54 have a size of 1.0, or when no size is set for the moving object models 54, the margin level computation unit 1142 may simply compute, as a usage amount, the number of the moving object models 54 positioned within a region of the cell.

Figures 11, 12:
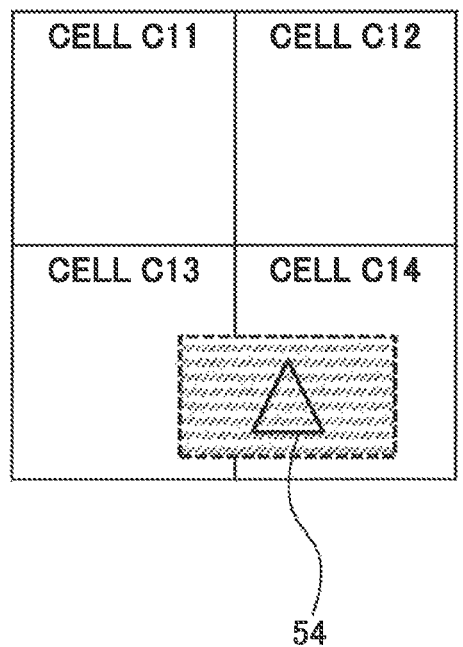
FIG. 11 is a diagram illustrating an example of a usage amount and a capacity of a candidate cell for a post-movement place.
FIG. 12 is a diagram illustrating an example of computation of a usage amount reflecting a position of a moving object model.

FIG. 11 is a diagram illustrating an example of a usage amount and a capacity of a cell derived by the margin level computation unit 1142. In the example illustrated in FIG. 11, a usage amount and a capacity of each of seven cells that are candidates for a post-movement place are derived. In each cell in FIG. 11, a usage amount is denoted on the left of a slash, and a capacity is denoted on the right of a slash. Specifically, in the example illustrated in FIG. 11, a usage amount of 1 and a capacity of 1 are derived for Cell C2, a usage amount of 1 and a capacity of 2 are derived for Cell C4, a usage amount of 2 and a capacity of 2 are derived for Cell C5, a usage amount of 2 and a capacity of 2 are derived for Cell C6, a usage amount of 2 and a capacity of 2 are derived for Cell C7, a usage amount of 2 and a capacity of 2 are derived for Cell C8, and a usage amount of 0 and a capacity of 2 are derived for Cell C9.

In the example illustrated in FIG. 11, the selected moving object model 54 itself is reflected on the usage amount of Cell C8, but the margin level computation unit 1142 may not reflect the selected moving object model 54 on a usage amount.

The margin level computation unit 1142 computes a margin level of a candidate on the basis of the usage amount and the capacity of the candidate.

A margin level is, for example, a value obtained by subtracting the usage amount from the capacity. According to a definition of the usage amount and a definition of the capacity in the above-described example embodiment, this value represents how many more moving objects can be accepted in the cell. Thus, it can be said that a cell readily accepts a moving object model when this value is large.

In the present example embodiment, the margin level computation unit 1142 computes, as a margin level, a value obtained by subtracting the usage amount from the capacity.

As described in detail in a modification example, the margin level is not limited to such a value. A margin level may be, for example, a ratio of the capacity to the usage amount. As described above, a margin level may be a measure of easiness in stepping into a region with which the cell is associated in the real world.

The margin level computation unit 1142 may compute, in advance at the beginning of a phase, margin levels of all cells included in the map 50. Then, when determining a post-movement place of the moving object model 54, the margin level computation unit 1142 may derive, by using data computed in advance, a margin level of a candidate post-movement place determined by a position and a reference direction of the moving object model 54. Then, when the moving object model 54 has moved, the margin level computation unit 1142 may update information on a margin level of only a cell associated with an ante-movement position and a post-movement position of the moving object model 54. In the simulation flow illustrated in FIG. 8, the margin level computation unit 1142 may only update margin levels of all cells at a time of updating a phase, in other words, at the beginning of each phase.

Modification Example of Method of Deriving Usage Amount

The margin level computation unit 1142 may compute a usage amount of a cell on the basis of a value that varies depending on a position and a size of the moving object model 54 around the cell.

For example, when the moving object model 54 is at a position as in FIG. 12, the margin level computation unit 1142 may regard this moving object model 54 as occupying a region represented by a shaded area in the diagram. In the example in FIG. 11, a region occupied by the moving object model 54 is a rectangle centered on the moving object model 54 and having a size corresponding to a size of the moving object model 54. The margin level computation unit 1142 determines, for example, an area of a portion of this rectangle overlapping with a cell, to be a usage amount of the moving object model 54 in the cell. In the case of the example illustrated in FIG. 12, when this moving object model 54 has a size of 1.0, for example, Cell C13 has a value of a usage amount of 0.2, and Cell C14 has a value of a usage amount of 0.8.

As described above, the margin level computation unit 1142 may compute a usage amount on the basis of the position and the size of the moving object model 54 inside and around a cell corresponding to a candidate place. With this configuration, a margin level better reflecting a state in the real world is obtained.

==Cell Determination Unit 1143==

The cell determination unit 1143 selects one cell among candidate cells on the basis of the margin level of each candidate, and determines the cell to be a cell corresponding to the post-movement place.

For example, the cell determination unit 1143 specifies a cell having a value of a margin level equal to or larger than a predetermined criterion. A predetermined criterion may be, for example, 1 or 0.5. A predetermined criterion may be a size of the selected moving object model 54. Incidentally, in the present example embodiment, a cell having a margin level of 1 or larger means a cell having a margin for accepting one moving object model 54 of a standard size. Then, the cell determination unit 1143 selects, among the specified cells, a cell closest to the reference direction of the moving object model 54. A cell closest to the reference direction is, for example, a cell such that a vector with a start point at the moving object model 54 and an end point at a centroid of the cell and a vector of the reference direction form the smallest angle. The cell determination unit 1143 determines the selected cell to be the cell corresponding to the post-movement place.

In the example illustrated in FIG. 11, there are two cells having a margin level of 1 or larger (in other words, a value of the usage amount is smaller than a value of the capacity by 1 or larger): Cell C4 and Cell C9. Among these cells, a cell closest to the reference direction (upward direction in the diagram) when viewed from a position of the moving object model 54 is Cell C4.

When a cell having a margin level equal to or larger than the predetermined criterion is not included in candidates, the cell determination unit 1143 may select a cell having the largest margin level. Alternatively, the cell determination unit 1143 may select a cell (C8) to which the moving object model 54 currently belongs.

In another example, the cell determination unit 1143 may select, from the beginning, a cell having the largest margin level among candidates. When there are a plurality of cells having the largest margin level, the cell determination unit 1143 may select a cell of the smallest density among the plurality of cells. The density is a value obtained by dividing the usage amount by the capacity. It is conceivable that, when there are a plurality of cells having an equal margin level, a person usually selects a candidate of small density. With the above-described method of determination, a simulation reflects such a nature of a person.

In still another example, the cell determination unit 1143 may select a cell on the basis of a value of a function of closeness between the reference direction and a value of the margin level. For example, the cell determination unit 1143 may associate, on the basis of closeness to the reference direction, a coefficient (for example, a coefficient that takes a larger value for a smaller angle θ formed by the reference direction and a centroid of the cell, such as Cos 2θ) that is an index of likelihood of being selected, with each of candidate cells, and may select a cell such that a product of the coefficient of the cell and the value of the margin level is the largest.

==Position Determination Unit 1144==

The position determination unit 1144 determines a post-movement position of the moving object model 54 on the basis of a cell determined by the cell determination unit 1143.

Figure 13:
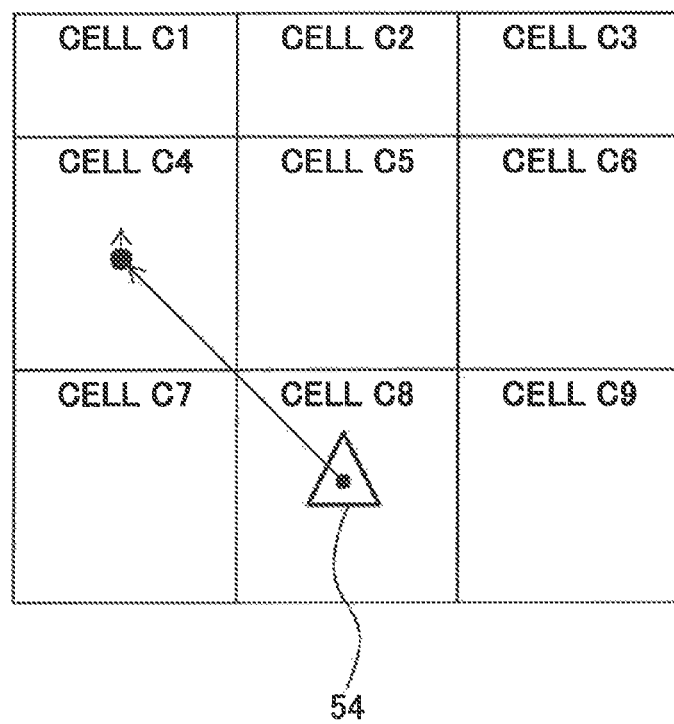
FIG. 13 is a diagram illustrating an example of a way of moving a moving object model.

FIG. 13 is a diagram illustrating an example of a way of determining a position of the moving object model 54 by the position determination unit 1144. In description thereof, the Cell C4 is the cell determined by the cell determination unit 1143.

For example, the position determination unit 1144 computes, as to a moving object model 54, a distance of a line segment linking between a current position of the moving object model 54 and a particular point (for example, a centroid, an inner center, or the like) within Cell C4. The particular point is a point that is set in advance for cells. For example, the particular point may be a midpoint of a side closest to the reference direction.

Then, when the step distance of the moving object model 54 is shorter than the distance of the above-described line segment, the position determination unit 1144 specifies, for example, a position advanced from a former position by the step distance on the above-described line segment, as a position in the post-movement place (hereinafter, a post-movement point) of the moving object model 54.

When the step distance of the moving object model 54 is longer than the distance of the above-described line segment, the position determination unit 1144 specifies, as a post-movement point, for example, a position advanced from an end edge (an endpoint different from a current position) of the above-described line segment in the reference direction by a difference between the step distance and the distance of the above-described line segment. Alternatively, the position determination unit 1144 may move the moving object model 54 to the above-described end edge, may further cause the cell determination unit 1143 to determine a post-movement place based on a margin level of surrounding cells, and may move the moving object model 54 toward the determined cell.

In such a case that a usage amount of the cell exceeds a capacity if the moving object model 54 moves to a cell corresponding to the post-movement place, the position determination unit 1144 may change a post-movement point depending on a margin level of the cell corresponding to the post-movement place. For example, when a usage amount of a cell corresponding to the post-movement place is smaller than a capacity by an amount of 0.5 at a point in time before movement, the position determination unit 1144 may determine a point on a side of the cell corresponding to the post-movement place as a post-movement point.

When a determined cell is a cell (Cell C8 in the example in FIG. 10) to which the moving object model 54 currently belongs, the position determination unit 1144 may determine a current position of the moving object model 54 or a predetermined position (for example, a point advanced in the reference direction to a boundary of the cell, etc.) to be a position in the post-movement place.

When the step distance is shorter than the distance of the above-described line segment even by employing any of the above-described examples, the post-movement point is a location between a former position and a particular point in the cell corresponding to the post-movement place. Further, when the step distance is longer than the distance of the above-described line segment, the post-movement point is a location to which the moving object model 54 is further moved in any direction from a particular point in the cell corresponding to the post-movement place.

One Example of Operation of Post-Movement Place Determination Unit 114

Figure 14:
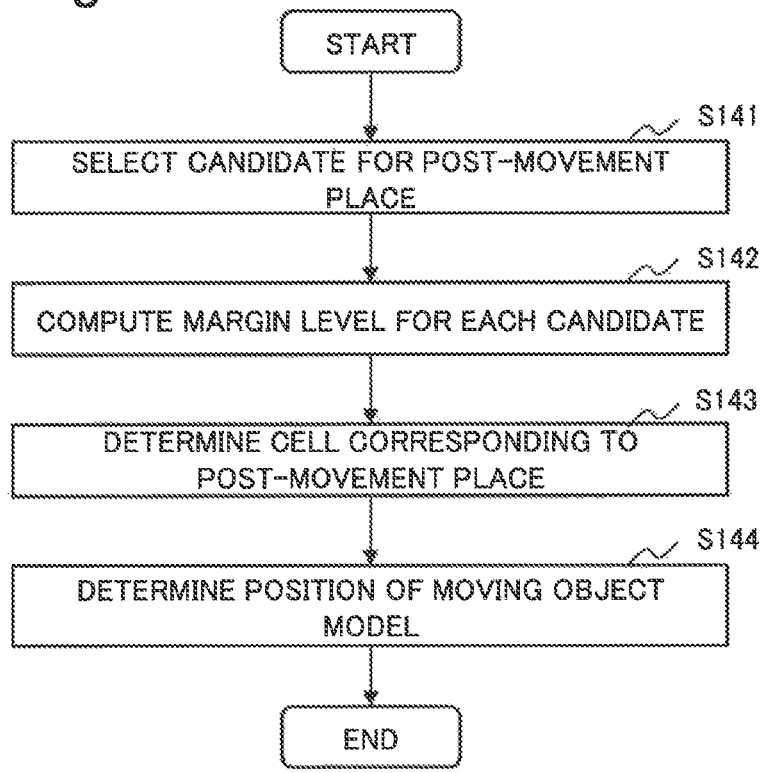
FIG. 14 is a flowchart illustrating an example of an operation flow for the post-movement place determination unit according to the first example embodiment.

An operation of the post-movement place determination unit 114 is described by using a flowchart illustrated in FIG. 14.

The post-movement place determination unit 114 acquires the position, the reference direction, and the step distance of the selected moving object model 54 from a component (for example, a not-illustrated storage unit, the update unit 115, or the like) for storing the state of the moving object model 54. The position and the reference direction of the moving object model 54 may be expressed by using an individual coordinate system for the section 51 or the intersection 52 in which the moving object model 54 is positioned. In particular, each unit of the post-movement place determination unit 114 is able to reduce a computation amount, by performing processing in subsequent steps on the basis of a coordinate system that uses, as a coordinate axis, an array direction of cells included in the section 51 (or the intersection 52) in which the selected moving object model 54 is positioned. However, when the section 51 or the intersection 52 different from the section 51 (or the intersection 52) in which the selected moving object model 54 is positioned may be a candidate for a post-movement place, for example, when the selected moving object model 54 exists in a cell including a boundary line, each unit of the post-movement place determination unit 114 may perform computation on the basis of a coordinate system of the entire map 50.

When a position and the like of the selected moving object model 54 are acquired, the candidate selection unit 1141 selects a candidate for a post-movement place of the moving object model 54 (Step S141).

Next, the margin level computation unit 1142 computes a margin level for each candidate cell (Step S142). The margin level computation unit 1142 may extract the margin level of the candidate by referring to already computed and stored data.

Then, the cell determination unit 1143 determines a cell corresponding to the post-movement place on the basis of the margin level of the candidate (Step S143). For example, the cell determination unit 1143 specifies cells each of which has a margin level of 1 or larger, and selects, among the specified cells, a cell closest to the reference direction.

Then, the position determination unit 1144 determines a position of the moving object model 54 (Step S144).

Another Example of Operation of Post-Movement Place Determination Unit 114

Figure 15:
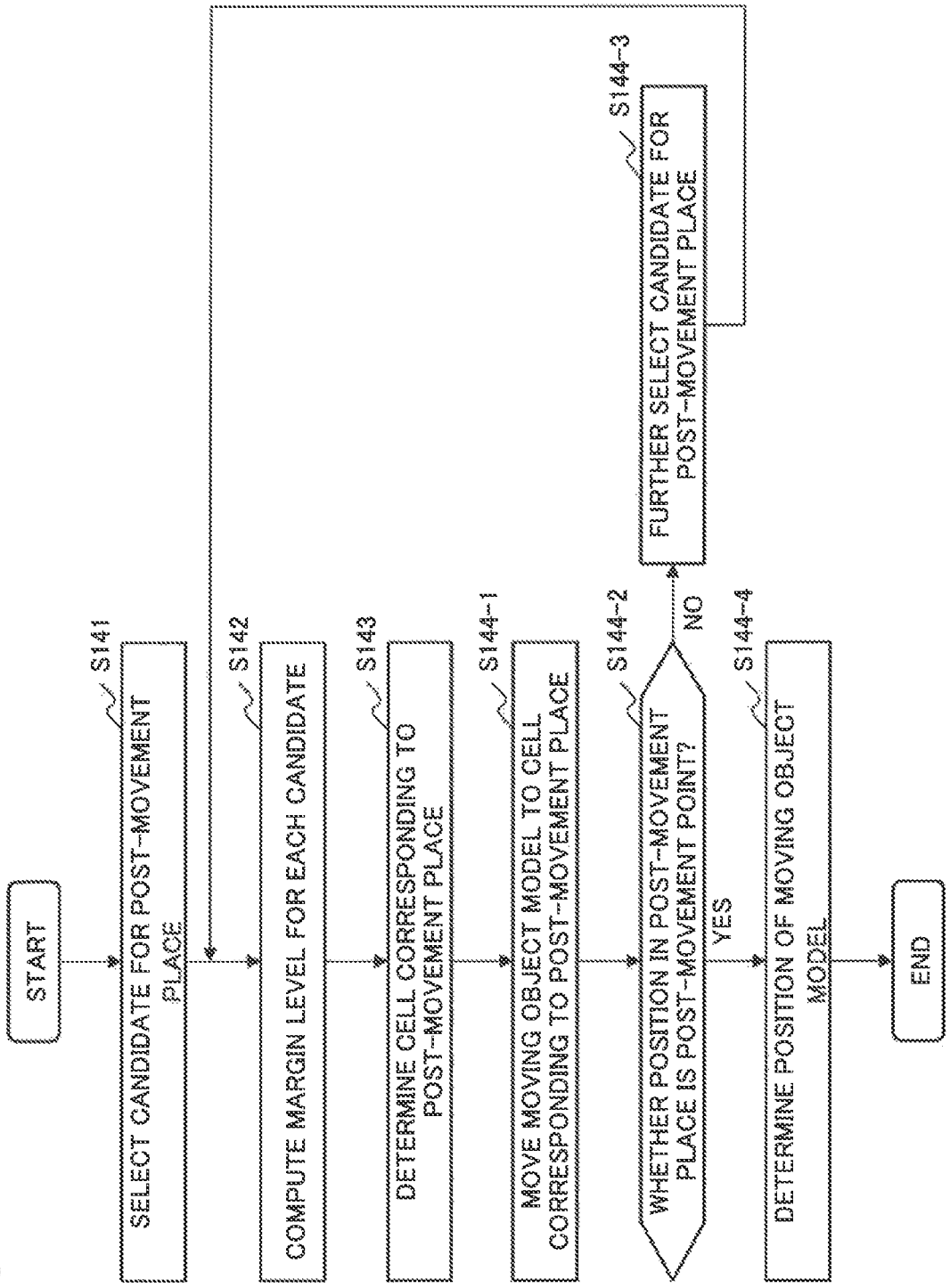
FIG. 15 is a flowchart illustrating another example of an operation flow for the post-movement place determination unit according to the first example embodiment.

When a line segment linking between a former position of the moving object model 54 and a centroid of the cell corresponding to the post-movement place is shorter than the step distance of the moving object model 54, the position determination unit 1144 may further determine a next post-movement place after moving the moving object model 54 to the centroid of the cell corresponding to the post-movement place. In this case, an operation flow for the post-movement place determination unit 114 is a flow as illustrated in FIG. 15.

In other words, after the cell determination unit 1143 determines the cell corresponding to the post-movement place in Step S143, the position determination unit 1144 moves the moving object model 54 to the cell corresponding to the post-movement place by using a predetermined algorithm (Step S144-1). Then, the position determination unit 1144 determines whether a position in the post-movement place is a post-movement point, in other words, whether a traveled distance is a step distance (Step S144-2). When a determination result is YES, the position determination unit 1144 determines the post-movement position to be a position of the moving object model 54 (Step S144-4). When a determination result is NO, the post-movement place determination unit 114 causes the candidate selection unit 1141 to further select a candidate for the post-movement place (Step S144-3), and performs operations in Steps S142 and S143. In other words, the post-movement place determination unit 114 determines a cell to which the moving object model 54 further moves next. In second determination of a candidate, a value obtained by subtracting an already traveled distance is used as a step distance.

As described above, the post-movement place determination unit 114 determines a post-movement point by repeating determination of a post-movement place and so on and moving the moving object model 54 until the moving object model 54 is moved by the step distance.

Modification Example 1

The post-movement place determination unit 114 may perform selection of the candidate and computation of the margin level alternately. For example, the post-movement place determination unit 114 may determine the cell corresponding to the post-movement place through the following procedure.

(1) . . . Specifying the section 51 in which the selected moving object model 54 is positioned. As a premise, the specified section 51 is constituted of m×n (m and n are both positive integers) cells, and that the post-movement place determination unit 114 identifies each cell as an element of a two-dimensional array (i, j) ($1 \leq i \leq m$, $1 \leq j \leq n$). As a premise, that a direction in which cells having an equal value of i are aligned is the reference direction.

(2) . . . Specifying a cell in which the selected moving object model 54 is positioned. The specified cell is Cell (a, b).

(3) . . . Computing a margin level of Cell (a, b+1).

(3-1) . . . When the margin level of Cell (a, b+1) is equal to or larger than 1, the Cell (a, b+1) is determined to be a post-movement place.

(3-2) . . . Computing, when the margin level of Cell (a, b+1) is not equal to or larger than 1, margin levels of Cell (a−1, b+1) and Cell (a+1, b+1).

(3-2-1) . . . When there is a cell having a margin level of 1 or larger in (3-2), the cell is determined to be a post-movement place. When both of the margin levels are equal to or larger than 1, a cell having a larger margin level is determined as a post-movement place.

(3-2-2) . . . Computing, when neither of the margin levels is equal to or larger than 1 in (3-2), margin levels of (Cell (a−1, b), Cell (a, b), and Cell (a+1, b)). A cell having the largest margin level among the computed margin levels is determined to be a post-movement place.

The above-described procedure enables simulation of a moving object with a small computation amount.

Modification Example 2

The margin level may be, for example, a ratio between the capacity and the usage amount. This value is a reciprocal of so-called density (a value obtained by dividing the usage amount by the capacity). The density is, in other words, proportion of a region regarded as being occupied, in a region of the cell, by the moving object model 54 on the map 50. The density can be said, in the real world, as a measure of reluctance in stepping into a region with which the cell is associated. Thus, it can be said that the smaller the density is, the more likely to accept the moving object model 54 the cell is. Accordingly, it can be said that a cell accepts the moving object model 54 more readily as a value of a reciprocal of the density is larger.

When the margin level computation unit 1142 computes a reciprocal of the density as the margin level, the cell determination unit 1143 may determine, among candidates having the reciprocal of the density exceeding 1, a cell closest to a reference direction to be a cell corresponding to the post-movement place.

Alternatively, the cell determination unit 1143 may determine, among candidates, a candidate having the largest reciprocal of the density to be a cell corresponding to the post-movement place.

Advantageous Effect

While the margin level of a candidate cell for a post-movement place is considered in determination of the position of the moving object model 54, the position of another moving object model 54 is not directly considered. Therefore, a simulation performed by the simulation device 11 is a simulation whose computational load is reduced in comparison with a simulation in which a position of the moving object model 54 is considered.

Processing of selecting a cell having a margin level equal to or larger than the predetermined criterion as a post-movement place simulates, in the real world, behavior that a moving object moves by selecting a spacious post-movement place with less people. Further, by selecting a cell close to the reference direction as a post-movement place, this simulation reflects a characteristic of a moving object that a moving object moves along a road in a manner as to approach a destination as much as possible. As described above, a simulation performed by the simulation device 11 is a simulation reflecting a characteristic of a moving object even with a reduced computational load.

As described above, the simulation device 11 according to the present example embodiment is capable of expressing behavior of a pedestrian or the like with a small computational load while suppressing inaccuracy in simulation.

(Characteristic of Reducing Computational Load)

A characteristic relating to a way of arraying cells also contributes to reduction of a computational load in simulation.

As in the above-described example embodiment, when cells in the section 51 are arrayed in a lattice shape along a direction of a road simulated by the section 51, a computation amount can be reduced by representing coordinates of the moving object model 54 by using a coordinate system that uses an array direction (a direction of a straight line defining a lattice) as a coordinate axis. For example, in such a case, a computational equation for specifying a cell in which the moving object model 54 is positioned is simple. Further, information (for example, the margin level) relating to cells within the section 51 based on a position of the moving object model 54 can be treated using a simple two-dimensional array. This facilitates specification of a cell adjacent to a cell in which the moving object model 54 is positioned.

Figure 16:
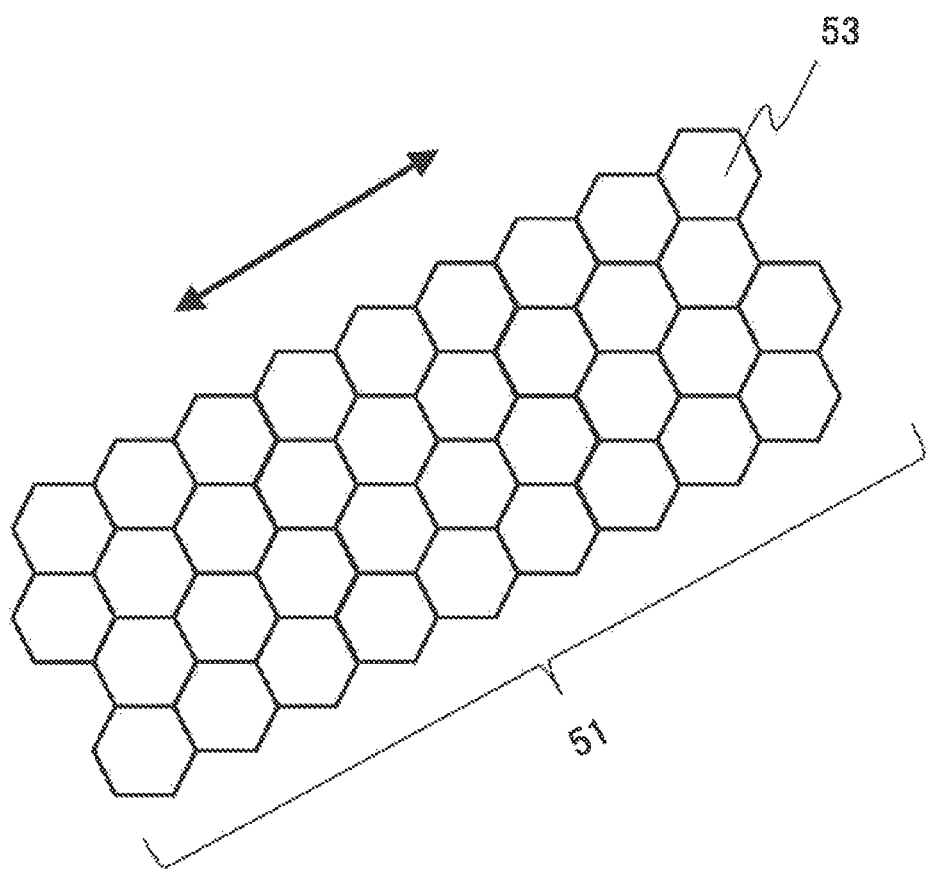
FIG. 16 is a diagram illustrating an example of configuring a section with cells arrayed in a honeycomb shape.

As in FIG. 16, also when the cells 53 in the section 51 are arrayed in a honeycomb shape along a direction of a road simulated by the section 51, simulation can be performed with a small computation amount, since an adjacent cell is easily specified. In FIG. 16, a direction in which an arrow points is a direction of a road.

<<Main Configuration>>

Figure 17:
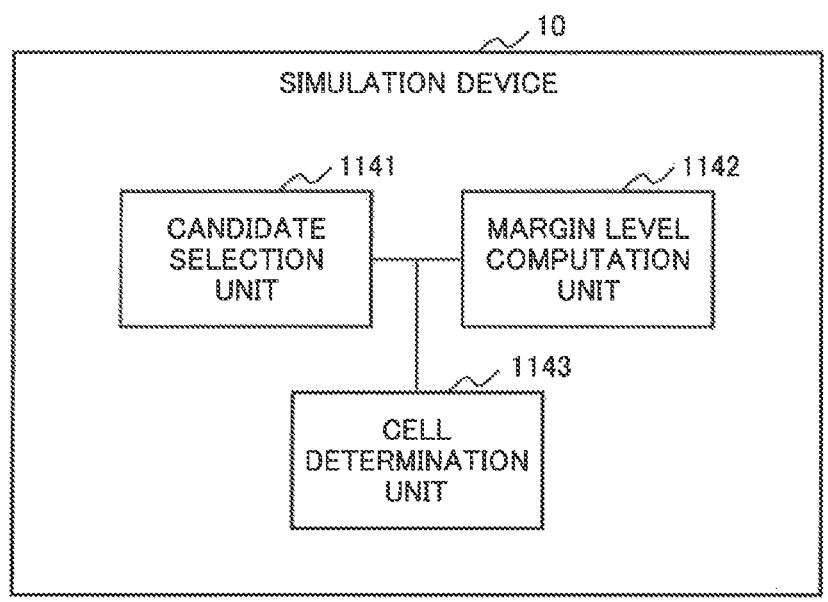
FIG. 17 is a block diagram illustrating a main configuration according to the present invention.

A simulation device 10 including a main configuration according to the above-described example embodiment is described. FIG. 17 is a block diagram illustrating a configuration of the simulation device 10.

The simulation device 10 includes a candidate selection unit 1141, a margin level computation unit 1142, and a cell determination unit 1143. The simulation device 10 determines, through processing of each unit, a post-movement place of a moving object model that is a virtual moving object positioned within a virtual map including a plurality of cells. A moving object model is associated in advance with, besides a position on the map, a reference direction serving as a reference for a direction in which the moving object model moves.

Figure 18:
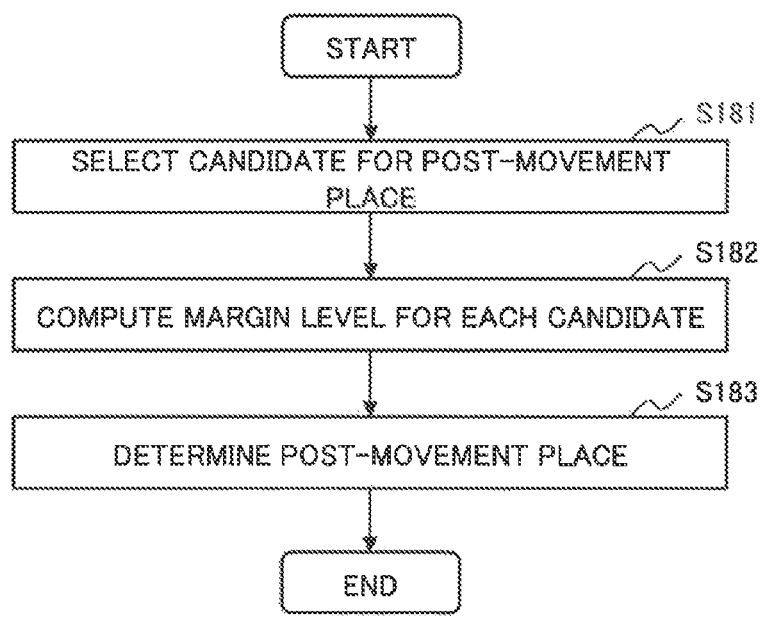
FIG. 18 is a flowchart illustrating an operation flow for the main configuration according to the present invention.

An operation flow of each unit of the simulation device 10 is described in accordance with a flowchart illustrated in FIG. 18. The candidate selection unit 1141 selects a candidate for a post-movement place of a moving object model (Step S181). Specifically, the candidate selection unit 1141 selects, on the basis of a position of the moving object model, one or more of cells included in the map, as a candidate(s) for a post-movement place of the moving object model. The candidate selection unit 1141 may select a candidate(s) on the basis of the position and the reference direction.

The margin level computation unit 1142 computes a margin level for each selected candidate (Step S182). A margin level of a cell is a degree of a margin of the cell for newly accepting a moving object model. A margin level of a cell is, for example, a value based on an extent of a region of the cell and an extent of an occupied region in the cell. An "occupied region" in a cell is, for example, a region occupied, in the cell, by a moving object model(s) (that may include or may not include the moving object model a post-movement place of which is to be determined) existing on the map. A region occupied by a moving object model in the cell may be a value dependent on the number of moving object models positioned within the cell. Alternatively, a region occupied by a moving object model in the cell may be, for example, a sum of values which are associated with the moving object models positioned within the cell and represent sizes of the moving object models respectively. A region occupied by a moving object model(s) in the cell may be, for example, an area of a region where a region occupied by the moving object model existing on the map and a region of the cell is overlapping each other. A region occupied by a moving object model(s) within the map may be determined on the basis of the position or the reference direction of the moving object model. The occupied region may include a region occupied, in the cell, by some kind of virtual object other than moving object models.

The cell determination unit 1143 determines, on the basis of the computed margin level and the reference direction, a cell corresponding to the post-movement place from among the candidates (Step S183). For example, the cell determination unit 1143 specifies, as a post-movement place, a candidate having the largest margin level, from among the candidates having a region in a range determined on the basis of the reference direction. Alternatively, for example, the cell determination unit 1143 determines the post-movement place from among the candidates having the margin level equal to or larger than the predetermined criterion, on the basis of a relation between the reference direction and a direction from the position of the moving object model toward a centroid of the candidate.

The above-described configuration is capable of reducing a load for computing behavior of a pedestrian or the like while suppressing inaccuracy in simulation. The reason for capability to reduce a computational load is that determination of a post-movement place is based on a margin level, not a distance or the like from another moving object model.

The reason for capability to suppress inaccuracy in simulation is that a method of determining a post-movement place is a method reflecting a characteristic of a moving object that a moving object moves to a spacious position while being based on a reference direction.

(Regarding Hardware Configuration)

Figure 19:
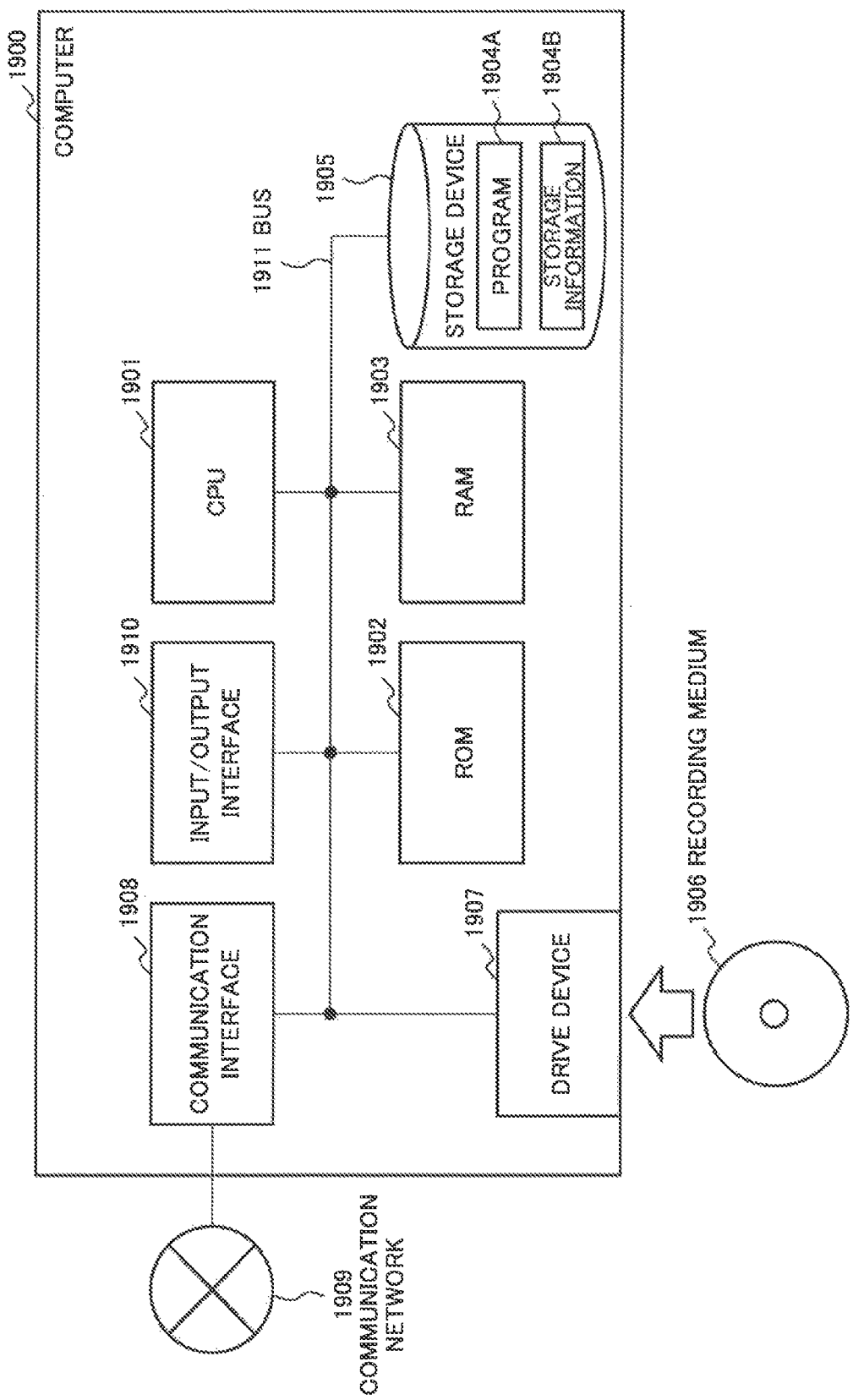
FIG. 19 is a block diagram illustrating an example of hardware that achieves each unit according to each example embodiment of the present invention.

In each example embodiment of the present invention described above, components of each device indicate blocks on a functional basis. Some or all of the components of each device are achieved, for example, by an applicable combination of a computer 1900 as illustrated in FIG. 19 and a program. The computer 1900 includes, as one example, components as follows.

a central processing unit (CPU) 1901
    a read only memory (ROM) 1902
    a random access memory (RAM) 1903
    a program 1904A and stored information 1904B loaded to the RAM 1903
    a storage device 1905 storing the program 1904A and stored information 1904B
    a drive device 1907 reading and writing from and to a recording medium 1906
    a communication interface 1908 connected with a communication network 1909
    an input/output interface 1910 inputting and outputting data
    a bus 1911 connecting the respective components Components of each device according to each example embodiment are achieved by loading, into the RAM 1903, and executing, by the CPU 1901, the program 1904A for achieving functions thereof. The program 1904A for achieving the functions of the components of each device is stored in, for example, the storage device 1905 or in the ROM 1902 in advance, and is read by the CPU 1901 as needed. The program 1904A may be supplied to the CPU 1901 via the communication network 1909, or the program stored in the recording medium 1906 in advance may be read and supplied to the CPU 1901 by the drive device 1907.

There are various modification examples of a method of implementing each device. For example, each of the devices may be achieved by applicable combinations of the computer 1900 and a program individually implemented for each component. Further, a plurality of components included in the device may be achieved by an applicable combination of one computer 1900 and a program.

Some or all of components of each device are implemented by another general-purpose or dedicated circuit, a computer, or the like, or by a combination thereof. These components may be achieved by a single chip, or may be achieved by a plurality of chips connected via a bus.

When some or all of components of each device are implemented by a plurality of computers, circuits, or the like, the plurality of computers, circuits, or the like may be centralizedly arranged, or may be dispersedly arranged. For example, computers, circuits, or the like may be implemented as a mode, such as a client and server system or a cloud computing system, in which the computers, circuits, or the like are mutually connected via a communication network.

All or part of the example embodiments described above may be described as in the following supplementary notes, but the present invention is not limited thereto.

(Supplementary Note 1)

A simulation device comprising:

candidate selection means for selecting, based on a position of a moving object model that is a virtual moving object positioned within a virtual map including a plurality of cells, one or more of the plurality of cells, as candidates for a post-movement place of the moving object model;

margin level computation means for computing, for each candidate of the candidates, a margin level that represents a degree of a margin of the each candidate for newly accepting the moving object model; and cell determination means for determining the post-movement place from among the candidates, based on the margin level and a reference direction associated with the moving object model.

(Supplementary Note 2)

The simulation device according to Supplementary Note 1, wherein the margin level of the candidate is a value based on an extent of a region of the candidate and an extent of an occupied region in the candidate.

(Supplementary Note 3)

The simulation device according to Supplementary Note 1 or 2, wherein the cell determination means determines the post-movement place from among the candidates having the margin level equal to or larger than a predetermined criterion, based on a relation between the reference direction and a direction from the position of the moving object model toward a centroid of the candidate.

(Supplementary Note 4)

The simulation device according to Supplementary Note 1 or 2, wherein the cell determination means determines that the candidate having the largest margin level among the candidates having a region in a range determined based on the reference direction is the post-movement place.

(Supplementary Note 5)

The simulation device according to any one of Supplementary Notes 1 to 4, wherein the map includes at least one division simulating an unbranched road, and the cells within the division are arrayed along a direction of the road simulated by the division, and the reference direction of the moving object model positioned within the division is parallel with the direction of the road.

(Supplementary Note 6)

The simulation device according to any one of Supplementary Notes 1 to 5, further comprising position determination means for determining a next position of the moving object model, based on the determined post-movement place and a movement distance set in advance for the moving object model.

(Supplementary Note 7)

The simulation device according to Supplementary Note 6, wherein, when a distance to a particular point within the determined cell is longer than the movement distance set in advance, the next position is a location between the point and the position of the moving object model, and, when the distance is shorter than the movement distance set in advance, the next position is a location to which the moving object model is further moved from the point in some direction.

(Supplementary Note 8)

A simulation system comprising:

the simulation device according to Supplementary Note 6 or 7, further including update means for updating the position of the moving object model with the determined next position; and a display device that displays the position of the moving object model on the map, each time the position is updated.

(Supplementary Note 9)

A simulation method comprising:

selecting, based on a position of a moving object model that is a virtual moving object positioned within a virtual map including a plurality of cells, one or more of the plurality of cells, as candidates for a post-movement place of the moving object model;

computing, for each candidate of the candidates, a margin level that represents a degree of a margin of the each candidate for newly accepting the moving object model; and determining the post-movement place from among the candidates, based on the margin level and a reference direction associated with the moving object model.

(Supplementary Note 10)

The simulation method according to Supplementary Note 9, wherein the margin level of the candidate is a value based on an extent of a region of the candidate and an extent of an occupied region in the candidate.

(Supplementary Note 11)

The simulation method according to Supplementary Note 9 or 10, comprising determining the post-movement place from among the candidates having the margin level equal to or larger than a predetermined criterion, based on a relation between the reference direction and a direction from the position of the moving object model toward a centroid of the candidate.

(Supplementary Note 12)

The simulation method according to Supplementary Note 9 or 10, comprising determining that the candidate having the largest margin level among the candidates having a region in a range determined based on the reference direction is the post-movement place.

(Supplementary Note 13)

The simulation method according to any one of Supplementary Notes 9 to 12, wherein the map includes at least one division simulating an unbranched road, and the cells within the division are arrayed along a direction of the road simulated by the division, and the reference direction of the moving object model positioned within the division is parallel with the direction of the road.

(Supplementary Note 14)

The simulation method according to any one of Supplementary Notes 9 to 13, further comprising determining a next position of the moving object model, based on the determined post-movement place and a movement distance set in advance for the moving object model.

(Supplementary Note 15)

The simulation method according to Supplementary Note 14, wherein, when a distance to a particular point within the determined cell is longer than the movement distance set in advance, the next position is a location between the point and the position of the moving object model, and, when the distance is shorter than the movement distance set in advance, the next position is a location to which the moving object model is further moved from the point in some direction.

(Supplementary Note 16)

The simulation method according to Supplementary Note 14 or 15, further comprising:

updating the position of the moving object model with the determined next position; and displaying the position of the moving object model on the map, each time the position is updated.

(Supplementary Note 17)

A non-transitory computer readable storage medium storing a program that causes a computer to perform:

candidate selection processing for selecting, based on a position of a moving object model that is a virtual moving object positioned within a virtual map including a plurality of cells, one or more of the plurality of cells, as candidates for a post-movement place of the moving object model;

margin level computation processing for computing, for each candidate of the candidates, a margin level that represents a degree of a margin of the each candidate for newly accepting the moving object model; and cell determination processing for determining the post-movement place from among the candidates, based on the margin level and a reference direction associated with the moving object model.

(Supplementary Note 18)

The storage medium according to Supplementary Note 17, wherein the margin level of the candidate is a value based on an extent of a region of the candidate and an extent of an occupied region in the candidate.

(Supplementary Note 19)

The storage medium according to Supplementary Note 17 or 18, wherein the cell determination processing determines the post-movement place from among the candidates having the margin level equal to or larger than a predetermined criterion, based on a relation between the reference direction and a direction from the position of the moving object model toward a centroid of the candidate.

(Supplementary Note 20)

The storage medium according to Supplementary Note 17 or 18, wherein the cell determination processing determines that the candidate having the largest margin level among the candidates having a region in a range determined based on the reference direction is the post-movement place.

(Supplementary Note 21)

The storage medium according to any one of Supplementary Notes 17 to 20, wherein the map includes at least one division simulating an unbranched road, and the cells within the division are arrayed along a direction of the road simulated by the division, and the reference direction of the moving object model positioned within the division is parallel with the direction of the road.

(Supplementary Note 22)

The storage medium according to any one of Supplementary Notes 17 to 21, wherein the program further causes the computer to perform position determination processing for determining a next position of the moving object model, based on the determined post-movement place and a movement distance set in advance for the moving object model.

(Supplementary Note 23)

The storage medium according to Supplementary Note 22, wherein, when a distance to a particular point within the determined cell is longer than the movement distance set in advance, the next position is a location between the point and the position of the moving object model, and, when the distance is shorter than the movement distance set in advance, the next position is a location to which the moving object model is further moved from the point in some direction.

(Supplementary Note 24)

The storage medium according to Supplementary Note 22 or 23, wherein the program causes the computer to perform:

update processing for updating the position of the moving object model with the determined next position; and display processing for causing a display device to display the position of the moving object model on the map, each time the position is updated.

The present invention is not limited to the above-described embodiments. Those of ordinary skill in the art may make variously changes in form and details of the above-described embodiments within scope of the present invention.

The present application claims the benefits of priority based on Japanese Patent Application No. 2016-144495, filed on Jul. 22, 2016, the entire disclosure of which is incorporated herein by reference.

INDUSTRIAL APPLICABILITY

The above-described simulation device is used for various applications in the case of evaluating an appearance of moving of a pedestrian or the like in a city area or the like. For example, when assuming that a crowd passes through a city area, the above-described simulation device may be used for evaluation or the like of each required time according to shapes or the like of roads through which the crowd passes.

As one specific example, the above-described simulation device may be used when a method of guiding a so-called stranded person who is caught in a difficulty in moving or going back home due to stop of a transport facility or the like at a time of a disaster.

It is assumed that, when a disaster or the like occurs and many of transport facilities are stopped, many persons in comparison with normal times go back home on foot as stranded persons, because of unavailability of transport facilities. In this case, there is a conceivable possibility that a large number of pedestrians heading to their respective different directions are aggregated in a city area of a big city. The above-described simulation device may be used for evaluation of an approach to guiding each pedestrian to a suitable road, in such a manner as to allow a large number of pedestrians to move smoothly as a whole.

When being used for evaluation of the approach as described above, the simulation device performs, for example, on the basis of information relating to a map that represents a road or the like in a city area, a simulation relating to an appearance of moving of pedestrians or the like who are stranded persons described above. For example, the map generation unit (110) of the simulation device generates the map simulating a road or the like in a city area, and the model generation unit (111) generates as many moving object models as the number of the pedestrians or the like. The simulation device performs a simulation on the basis of the generated map and the moving object models. By executing this simulation repeatedly while changing various conditions, an approach to guiding the pedestrians or the like who are stranded persons is evaluated.

REFERENCE SIGNS LIST

10, 11 simulation device
21 display device 50 map
51 section
52 intersection
53, C1-C9, C11-C14 cell
54 moving object model
110 map generation unit
111 model generation unit
112 control unit
113 model selection unit
114 post-movement place determination unit
115 update unit
1141 candidate selection unit
1142 margin level computation unit
1143 cell determination unit
1144 position determination unit
1900 computer
1901 CPU
1902 ROM
1903 RAM
1904A program
1904B stored information
1905 storage device
1906 recording medium
1907 drive device
1908 communication interface
1909 communication network
1910 input/output interface
1911 bus

What is claimed is:

1. A simulation device comprising:
a memory; and
a processor coupled to the memory and configured to:
select, based on a position of a moving object model that is a virtual moving object positioned within a virtual map including a plurality of cells, one or more of the plurality of cells, as candidate cells for a post-movement place of the moving object model;
compute, for each candidate cell, a margin level that represents a degree of a margin of the each candidate cell for newly accepting the moving object model; and
determine the post-movement place from among the candidate cells, based on the margin level and a reference direction associated with the moving object model,
wherein the moving object model is a virtual moving pedestrian or a virtual moving vehicle.

2. The simulation device according to claim 1, wherein the margin level of the candidate cell is a value based on an extent of a region of the candidate cell and an extent of an occupied region in the candidate cell.

3. The simulation device according to claim 1, wherein the processor is further configured to
determine the post-movement place from among the candidate cells having the margin level equal to or larger than a predetermined criterion, based on a relation between the reference direction and a direction from the position of the moving object model toward a centroid of the candidate cell.

4. The simulation device according to claim 1, wherein the processor is further configured to
determine, that the candidate cell having a largest margin level among the candidate cells having a region in a range determined based on the reference direction is the post-movement place.

5. The simulation device according to claim 1, wherein the virtual map has at least one division simulating an unbranched road, and cells which belongs to the plurality of cells and are within the division are arrayed along a direction of the unbranched road simulated by the division, and
the reference direction of the moving object model positioned within the division is parallel with the direction of the unbranched road.

6. The simulation device according to claim 1, wherein the processor is further configured to
determine a next position of the moving object model, based on the determined post-movement place and a movement distance set in advance for the moving object model.

7. The simulation device according to claim 6, wherein, when a distance to a particular point is longer than the movement distance set in advance, the next position is a location between the particular point and the position of the moving object model, and, when the distance is shorter than the movement distance set in advance, the next position is a location to which the moving object model is further moved from the particular point in some direction.

8. The simulation device according to claim 6, wherein the processor is further configured to:
update the position of the moving object model with the determined next position; and
cause a display device to display the position of the moving object model on the virtual map, each of a plurality of times the position is updated.

9. The simulation device according to claim 1, wherein the plurality of candidate cells comprise first cells of identical shape for the candidate cells that do not have a border with an outer periphery, and second cells of shapes according to a shape of the virtual map for the candidate cells that have the border with the outer periphery of the virtual map.

10. A simulation method comprising:
selecting, based on a position of a moving object model that is a virtual moving object positioned within a virtual map including a plurality of cells, one or more of the plurality of cells, as candidate cells for a post-movement place of the moving object model;
computing, for each candidate cell, a margin level that represents a degree of a margin of the each candidate cell for newly accepting the moving object model; and
determining the post-movement place from among the candidate cells, based on the margin level and a reference direction associated with the moving object model,
wherein the moving object model is a virtual moving pedestrian or a virtual moving vehicle.

11. The simulation method according to claim 10, wherein the margin level of the candidate cell is a value based on an extent of a region of the candidate cell and an extent of an occupied region in the candidate cell.

12. The simulation method according to claim 10, comprising
determining that the candidate cell having a largest margin level among the candidate cells having a region in a range determined based on the reference direction is the post-movement place.

13. The simulation method according to claim 10, wherein
the virtual map includes at least one division simulating an unbranched road, and cells which belongs to the plurality of cells and are within the division are arrayed along a direction of the unbranched road simulated by the division, and the reference direction of the moving object model positioned within the division is parallel with the direction of the unbranched road.

14. The simulation method according to claim 10, further comprising
determining a next position of the moving object model, based on the determined post-movement place and a movement distance set in advance for the moving object model.

15. A non-transitory computer readable storage medium storing a program that causes a computer to perform:
candidate selection processing for selecting, based on a position of a moving object model that is a virtual moving object positioned within a virtual map including a plurality of cells, one or more of the plurality of cells, as candidate cells for a post-movement place of the moving object model;
margin level computation processing for computing, for each candidate cell, a margin level that represents a degree of a margin of the each candidate cell for newly accepting the moving object model; and
cell determination processing for determining the post-movement place from among the candidate cells, based on the margin level and a reference direction associated with the moving object model,
wherein the moving object model is a virtual moving pedestrian or a virtual moving vehicle.

16. The storage medium according to claim 15, wherein the margin level of the candidate cell is a value based on an extent of a region of the candidate cell and an extent of an occupied region in the candidate cell.

17. The storage medium according to claim 15, wherein the cell determination processing determines that the candidate cell having a largest margin level among the candidate cells having a region in a range determined based on the reference direction is the post-movement place.

18. The storage medium according to claim 15, wherein the virtual map has at least one division simulating an unbranched road, and cells which belongs to the plurality of cells and are within the division are arrayed along a direction of the unbranched road simulated by the division, and
the reference direction of the moving object model positioned within the division is parallel with the direction of the unbranched road.

19. The storage medium according to claim 15, wherein the program further causes the computer to perform
position determination processing for determining a next position of the moving object model, based on the determined post-movement place and a movement distance set in advance for the moving object model.

20. The storage medium according to claim 19, wherein the program causes the computer to perform:
update processing for updating the position of the moving object model with the determined next position; and
display processing for causing a display device to display the position of the moving object model on the virtual map, each of a plurality of times the position is updated.

* * * * *